(12) United States Patent
Goel et al.

(10) Patent No.: US 11,549,984 B2
(45) Date of Patent: Jan. 10, 2023

(54) SCAN ARCHITECTURE FOR INTERCONNECT TESTING IN 3D INTEGRATED CIRCUITS

(71) Applicant: Taiwan Semiconductor Manufacturing Co., Ltd., Hsinchu (TW)

(72) Inventors: Sandeep Kumar Goel, Dublin, CA (US); Yun-Han Lee, Boashan Township (TW); Saman M. I. Adham, Kanata (CA); Marat Gershoig, Ottawa (CA)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 391 days.

(21) Appl. No.: 16/724,787

(22) Filed: Dec. 23, 2019

(65) Prior Publication Data

US 2020/0124668 A1 Apr. 23, 2020

Related U.S. Application Data

(62) Division of application No. 15/171,531, filed on Jun. 2, 2016, now Pat. No. 10,539,617.

(51) Int. Cl.
*G01R 31/3177* (2006.01)
*G01R 31/3185* (2006.01)
(Continued)

(52) U.S. Cl.
CPC ..... *G01R 31/3177* (2013.01); *G01R 31/2896* (2013.01); *G01R 31/31703* (2013.01);
(Continued)

(58) Field of Classification Search
CPC ............ G01R 31/3177; G01R 31/2896; G01R 31/31703; G01R 31/318513;
(Continued)

(56) References Cited

U.S. PATENT DOCUMENTS 5,546,406 A * 8/1996 Gillenwater ... G01R 31/318541
714/733
8,448,100 B1 5/2013 Lin et al.
(Continued)

*Primary Examiner* — April Y Blair
*Assistant Examiner* — Rong Tang
(74) *Attorney, Agent, or Firm* — Duane Morris LLP

(57) ABSTRACT

In one embodiment, a device comprises: a first die having disposed thereon a first plurality of latches wherein ones of the first plurality of latches are operatively connected to an adjacent one of the first plurality of latches; and a second die having disposed thereon a second plurality of latches wherein ones of the second plurality of latches are operatively connected to an adjacent one of the second plurality of latches. Each latch of the first plurality of latches on said first die corresponds to a latch in the second plurality of latches on said second die. Each set of corresponding latches are operatively connected. A scan path comprises a closed loop comprising each of said first and second plurality of latches. One of the second plurality of latches is operatively connected to another one of the second plurality of latches via an inverter.

20 Claims, 26 Drawing Sheets

(51) Int. Cl.
  *G01R 31/28* (2006.01)
  *G01R 31/317* (2006.01)

(52) U.S. Cl.
  CPC ........... *G01R 31/318513* (2013.01); *G01R 31/318536* (2013.01); *G01R 31/318538* (2013.01); *G01R 31/318552* (2013.01); *G01R 31/318566* (2013.01)

(58) Field of Classification Search
  CPC .... G01R 31/318536; G01R 31/318538; G01R 31/318552; G01R 31/318566; G01R 31/318541; G01R 31/31855
  See application file for complete search history.

(56) References Cited

U.S. PATENT DOCUMENTS

| | | | |
|---|---|---|---|
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,896,094 B2 | 11/2014 | Yen et al. | |
| 9,016,939 B2 | 4/2015 | Chang et al. | |
| 9,086,452 B2 | 7/2015 | Wang et al. | |
| 9,165,968 B2 | 10/2015 | Chao et al. | |
| 9,171,798 B2 | 10/2015 | Lin et al. | |
| 9,172,242 B2 | 10/2015 | Chang et al. | |
| 9,219,038 B2 | 12/2015 | Horng et al. | |
| 9,689,918 B1* | 6/2017 | Cheng | G01R 31/318547 |
| 2007/0168776 A1* | 7/2007 | Grose | G11C 29/12 |
| | | | 714/718 |
| 2012/0221906 A1* | 8/2012 | Shetty | G01R 31/31855 |
| | | | 714/E11.155 |
| 2013/0193981 A1 | 8/2013 | Chen et al. | |
| 2013/0246990 A1 | 9/2013 | Yen et al. | |
| 2013/0320553 A1 | 12/2013 | Kuo et al. | |
| 2014/0015583 A1* | 1/2014 | Goel | G01R 31/318513 |
| | | | 327/261 |
| 2014/0126274 A1 | 5/2014 | Lee et al. | |
| 2014/0167799 A1 | 6/2014 | Wang et al. | |
| 2014/0195728 A1 | 7/2014 | Hsu et al. | |
| 2014/0239427 A1 | 8/2014 | Huang et al. | |
| 2014/0266273 A1 | 9/2014 | Wang et al. | |
| 2016/0169972 A1* | 6/2016 | Douskey | G01R 31/318541 |
| | | | 714/726 |
| 2016/0211241 A1* | 7/2016 | Law | H01L 25/0657 |
| 2017/0322843 A1* | 11/2017 | Hsu | G06F 11/108 |

* cited by examiner

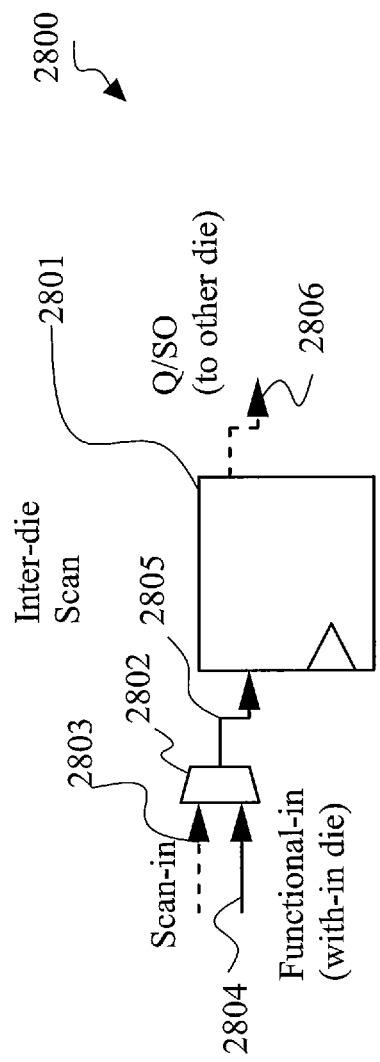
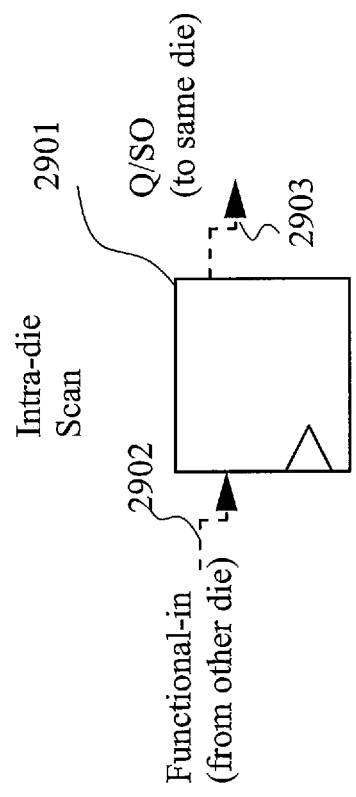
Fig. 2B
Fig. 2C

Fault Free circuit

| N° | D1 hild viol | D2 hild viol | D3 hild viol | D4 hild viol | D5 hild viol | D6 hild viol | D7 hild viol |
|---|---|---|---|---|---|---|---|
| 1 | 0 | 0 | 0 | 0 | 0 | 0 | 0 |
| 2 | 0 | 0 | 0 | 0 | 0 | 0 | 0 |
| 3 | 0 | 0 | 0 | 0 | 0 | 0 | 0 |
| 4 | 0 | 0 | 0 | 0 | 0 | 0 | 0 |
| 5 | 0 | 0 | 0 | 1 | 1 | 1 | 0 |
| 6 | 1 | 1 | 1 | 1 | 1 | 1 | 1 |
| 7 | 1 | 1 | 1 | 1 | 1 | 1 | 1 |
| 8 | 1 | 1 | 1 | 1 | 1 | 1 | 1 |
| 9 | 1 | 1 | 1 | 1 | 1 | 1 | 1 |
| 10 | 1 | 1 | 1 | 0 | 0 | 0 | 1 |
| 11 | 1 | 0 | 0 | 0 | 0 | 0 | 0 |
| 12 | 1 | 0 | 0 | 0 | 0 | 0 | 0 |
| 13 | 0 | 0 | 0 | 0 | 0 | 0 | 0 |
| 14 | 0 | 0 | 0 | 0 | 0 | 0 | 0 |

| N° | D1 setup viol | D2 setup viol | D3 setup viol | D4 setup viol | D5 setup viol | D6 setup viol | D7 setup viol |
|---|---|---|---|---|---|---|---|
| 1 | 0 | 1 | 1 | 1 | 1 | 1 | 1 |
| 2 | 0 | 0 | 0 | 0 | 0 | 0 | 0 |
| 3 | 0 | 0 | 0 | 0 | 0 | 0 | 0 |
| 4 | 0 | 0 | 0 | 0 | 0 | 0 | 0 |
| 5 | 0 | 0 | 0 | 0 | 0 | 0 | 0 |
| 6 | 0 | 0 | 0 | 0 | 0 | 0 | 0 |
| 7 | 0 | 0 | 0 | 0 | 0 | 0 | 0 |
| 8 | 1 | 1 | 1 | 1 | 1 | 1 | 0 |
| 9 | 1 | 1 | 1 | 1 | 1 | 1 | 1 |
| 10 | 1 | 1 | 1 | 1 | 1 | 1 | 1 |
| 11 | 1 | 1 | 1 | 1 | 1 | 1 | 1 |
| 12 | 1 | 1 | 1 | 1 | 1 | 1 | 1 |
| 13 | 1 | 1 | 1 | 1 | 1 | 1 | 1 |
| 14 | 1 | 1 | 1 | 1 | 1 | 1 | 1 |

SCAN ARCHITECTURE FOR INTERCONNECT TESTING IN 3D INTEGRATED CIRCUITS

CROSS-REFERENCE TO RELATED APPLICATIONS

The present application is a divisional of U.S. patent application Ser. No. 15/171,531, filed on Jun. 2, 2016, which is incorporated by reference herein in its entirety.

BACKGROUND

The 3D-IC approach uses a combination of standard single damascene techniques, wafer thinning, and direct Cu—Cu thermo-compression bonding. Hybrid bonding is a cost-effective, die-to-wafer integration processes for vertical stacking and high density die-to-die interconnecting.

In general, direct hybrid bonding is compatible with both die-to-die (D2D) and wafer-on-wafer (WoW) bonding. In direct hybrid bonding, a dual damascene copper and silicon oxide hybrid interface between dies serves as both the full-area substrate bonding mechanism and the electrical connection between pads and/or vias on respective dies.

Design-for-Testing or Design for Testability ("DFT") refers to integrated circuit design techniques that add certain testability features to a hardware product design. The DFT features make it easier to develop and apply various manufacturing tests for the designed hardware. The purpose of manufacturing tests is to validate that the hardware products contain no manufacturing defects that could adversely affect the product's proper functioning. Scan chain is one example of a technique implemented in a DFT process.

BRIEF DESCRIPTION OF THE DRAWINGS

Aspects of the present disclosure are best understood from the following detailed description when read with the accompanying figures. Various features are not drawn to scale. In fact, the dimensions of the various features may be arbitrarily increased or reduced for clarity of discussion.

FIG. 2B is a schematic illustration of a scan flip-flop in accordance with some embodiments.

FIG. 2C is a schematic illustration of a D flop in accordance with some embodiments.

FIG. 18 is a logic table of a circuit with 7 flip-flops under hold faults in accordance with some embodiments.

FIG. 19 is a logic table of a circuit with 7 flip-flops under setup faults in accordance with some embodiments.

DETAILED DESCRIPTION

Figure 1A:
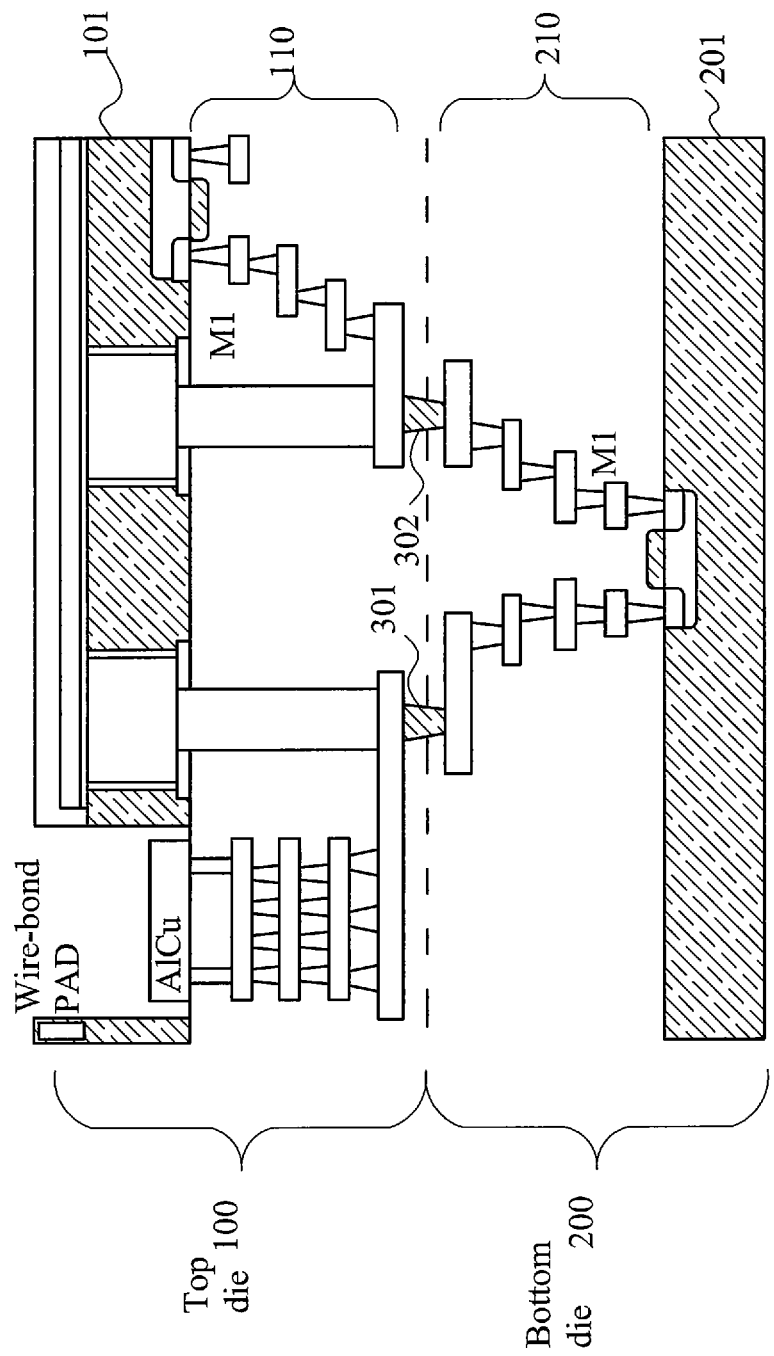
FIG. 1A is a cross-sectional view of the hybrid bonded 3DIC in accordance to some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
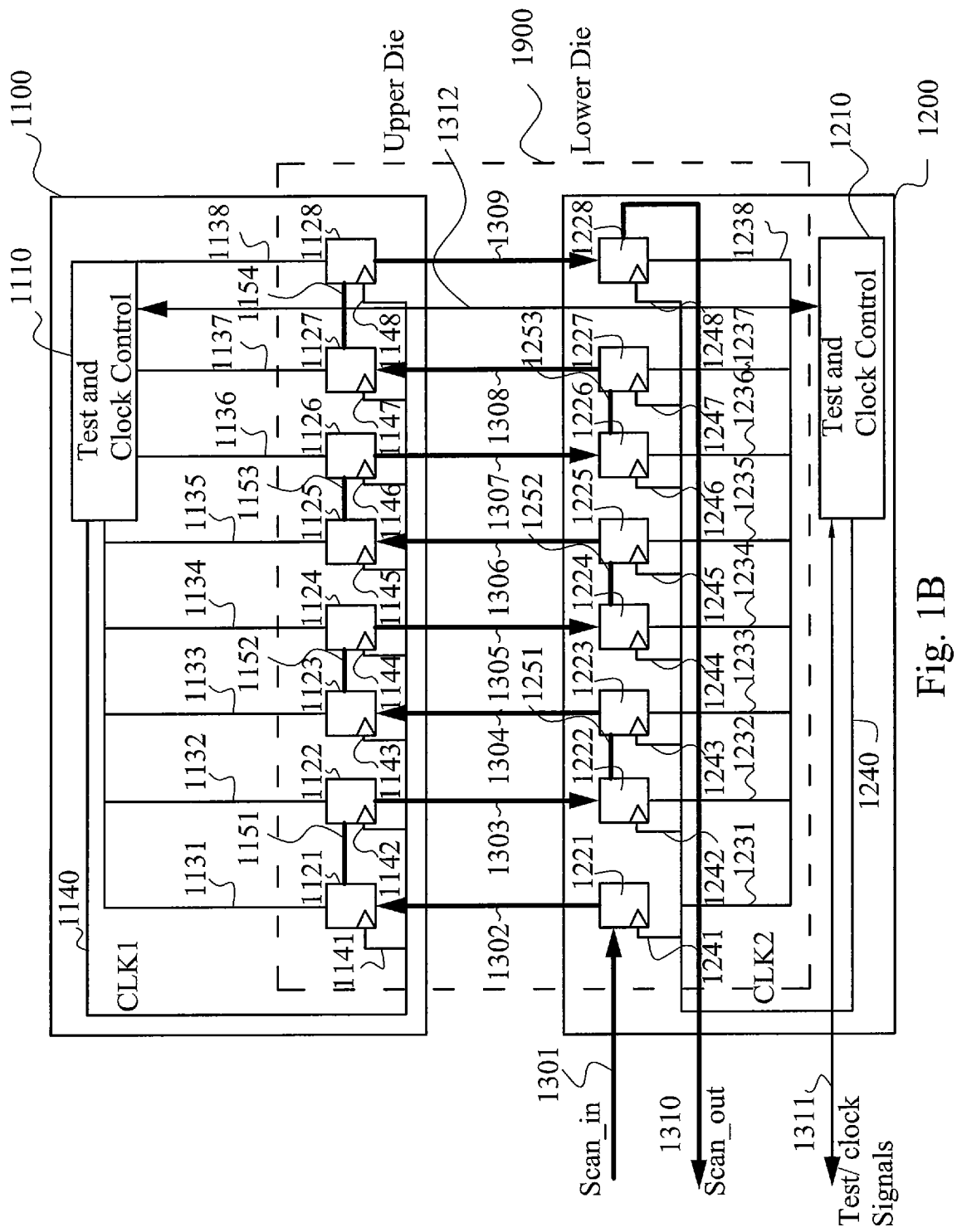
FIG. 1B is a schematic diagram of a serial cross-bar scan architecture in accordance with some embodiments.

FIG. 1A is a cross-sectional view of a hybrid bonded 3D stack in accordance to some embodiments. The top die 100 includes a semiconductor (e.g., silicon) substrate 101, and the bottom die includes a semiconductor (e.g., silicon) substrate 201. Both the substrates 101 and 201 include functional circuits in them. The functional circuits include active devices, such as transistors, shown in substrates 101 and 102 and interconnects 110, 210 in each die. The interconnect layer 110 of the top die 100 and the interconnect layer 210 of the bottom die 200 are connected by hybrid bonding structures 301 and 302. FIG. 1B is a schematic diagram of a serial cross-bar scan architecture in accordance with some embodiments. The serial cross-bar scan architecture includes an upper die 1100 and a lower die 1200. The upper die 1100 is stacked above the lower die 1200. According to some embodiments, the bonding between the upper die 1100 and the lower die 1200 is hybrid bonding, which is a cost-competitive solution for vertical stacking and provides high density die-to-die interconnect. According to some embodiments, the pitch between the interconnections is, for example, 1 um or less. Hybrid bonding reduces leakage, power consumption and device footprint compared to a 3DIC in which connections between active devices on stacked dies include through-substrate-vias (TSV). Each of the lines 1302, 1303, 1304, . . . 1309 represents a combination of one or more vias and/or one or more pads in each of the upper die 1100 and lower die 1200.

In other embodiments (not shown), interconnections between stacked dies in the 3DIC include TSVs. In other embodiments (not shown), the 3DIC is a stacked CMOS package, in which interconnections between tiers include inter-tier vias (ITV) also referred to as inter-level vias (ILV).

Some embodiments of a scan chain include the following set of signals in order to control and observe the scan mechanism. Scan_In (SI) and Scan_Out (SO) are the input and output of a scan chain, respectively. A shift enable pin (SE) is a special signal that is added to a design. When SE is asserted, every latch in the scan chain is connected to a respective bit of a shift register. A clock signal is used for controlling all the latches, or flip-flops, in the chain during testing of the IC. An arbitrary test pattern (for example, a vector of random zeroes and ones) can be entered into the chain of latches, and the state of every latch can be read out.

As shown in FIG. 1B, the architecture includes a wrapper around the interface between the upper die 1100 and lower die 1200. The wrapper includes a respective wrapper cell (e.g., flip-flops 1121-1128 and 1221-1228) in each of the dies 1100, 1200 on each side of each inter-die connection 1302-1309, Additional intra-die connections 1151-1154 and 1251-1253 are added to form a scan path 1900, which functions as a shift register during scan chain testing. The scan shift path (scan path) is the route that the signal follows during a scan test. According to some embodiments, the scan shift path includes latches in the upper die and the lower die, their corresponding interconnections between dies and connections between latches in the same die. According to some embodiments, the scan shift path starts with a scan input, and ends with at least one scan output. The scan path includes a continuously connected set of latches and interconnections between and within dies, for shifting data from the scan input to the scan output.

The upper die 1100 includes a test and clock control unit 1110 and a plurality of flip-flops 1121, 1122, 1123, 1124, 1125, 1126, 1127 and 1128. According to some embodiments, the flip-flops 1121 . . . 1128 are of the same type, according to other embodiments, the flip-flops 1121 . . . 1128 are of two or more different types. The test and clock control unit 1110 transmits a clock signal CLK1 through the line 1140. The clock signal CLK1 controls the flops 1121 . . . 1128 through 1141, 1142, 1143, 1144, 1145, 1146, 1147 and 1148, respectively. The test and clock control unit 1110 controls the flip-flops 1121 . . . 1128 through 1131, 1132, 1133, 1134, 1135, 1136, 1137 and 1138, respectively. The output of the flip-flop 1121 is transmitted to the input of flip-flop 1122 through line 1151; the output of the flip-flop 1123 is transmitted to the input of the flip-flop 1124 through line 1152; the output of the flip-flop 1125 is transmitted to the input of the flip-flop 1126 through line 1153; the output of the flip-flop 1127 is transmitted to the input of the flip-flop 1128 through line 1154.

Similarly, the lower die 1200 includes a test and clock control unit 1210 and a plurality of flops 1221, 1222, 1223, 1224, 1225, 1226, 1227 and 1228. According to some embodiments, the flip-flops 1221 . . . 1228 are of the same type of flip-flops, according to other embodiments, the flip-flops 1221 . . . 1228 are of different types of flip-flops. The test and clock control unit 1210 transmits a clock signal CLK2 through line 1240, the clock signal CLK2 controls the flip-flops 1221 . . . 1228 through 1241, 1242, 1243, 1244, 1245, 1246, 1247 and 1248 respectively. The test and clock control unit 1210 controls the flip-flops 1221 . . . 1228 through 1231, 1232, 1233, 1234, 1235, 1236, 1237 and 1238 respectively. The scan in signal 1301 is transmitted to the flip-flop 1221. The output of the flip-flop 1222 is transmitted to the input of flip-flop 1223 through line 1251, the output of the flip-flop 1224 is transmitted to the input of the flip-flop 1225 through line 1252, the output of the flip-flop 1226 is transmitted to the input of the flip-flop 1227 through line 1253, the output of the flip-flop 1228 is the scan out 1310. The test and clock control unit 1110 in the upper die 1100 and the test and clock control unit 1210 in the lower die 1200 communicate through line 1312.

Figure 2A:
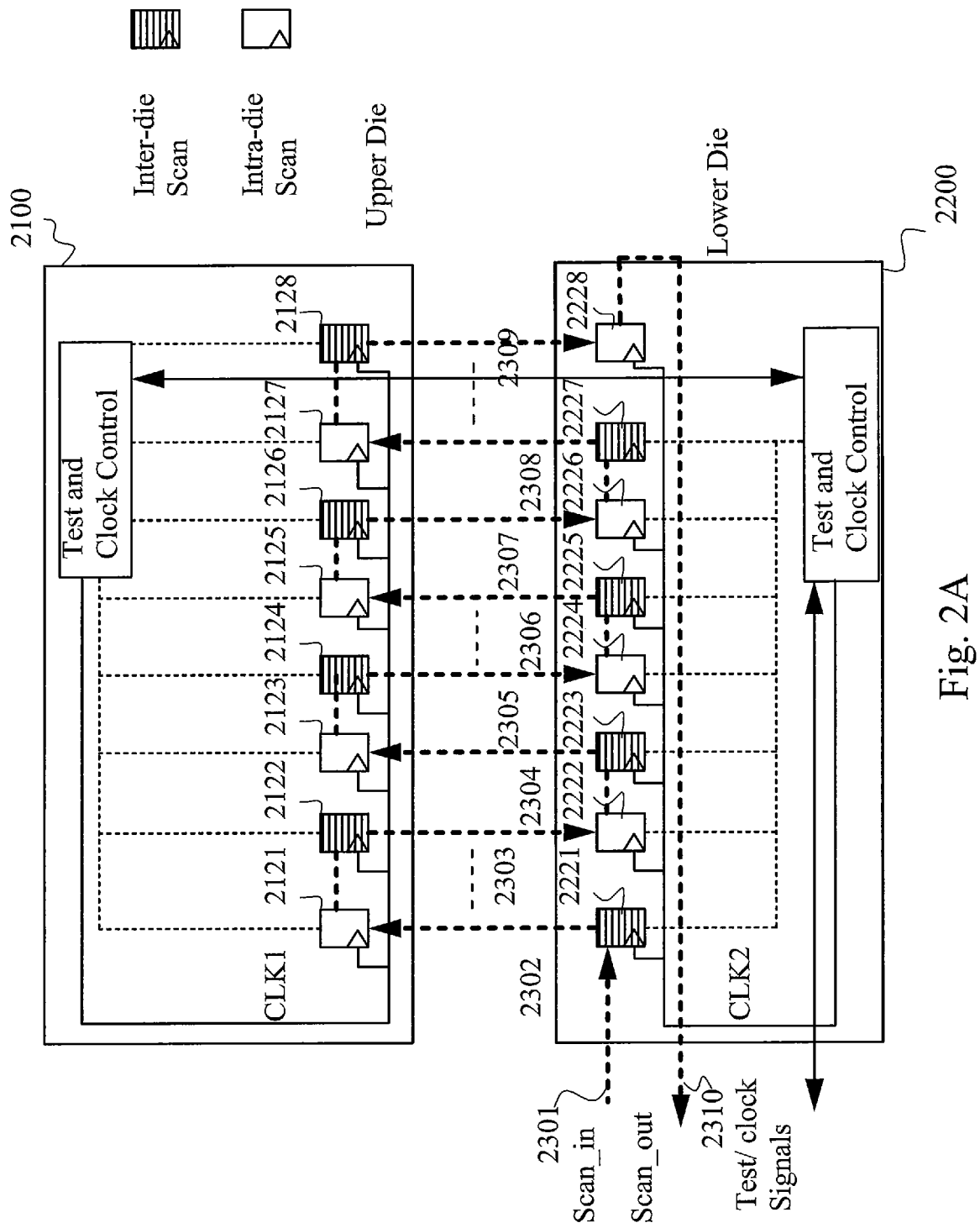
FIG. 2A is a schematic diagram of a serial cross-bar scan architecture with D flip-flops and scan flops in accordance with some embodiments.

An inter-die scan path 1900 designated by dashed line can be created by embedding at least one functional path in a scan shift path. A functional path is a path that is not dedicated to the scan chain for testing purposes only, but rather is included in a functional circuit that performs other non-testing functions. The functional path can include one or more interconnect lines and/or interconnect vias within one of the dies. According to some embodiments, the embedded functional path includes other passive and/or active elements. The scan chain acts as a shift register during scan chain testing. In some embodiments, a functional path connected to a circuit is connected to a multiplexer in the scan shift path, and the multiplexer can be used to select either a test pattern input or a signal on the functional path connected to the functional circuit This allows scan chain testing across functional paths, in addition to the interconnections shown in FIG. 1B. The inter-die scan path 1900 starts at the scan in signal 1301, then passes through, in order, flip-flop 1221, line 1302, flip-flop 1121, line 1151, flip-flop 1122, line 1303, line 1303, flip-flop 1222, line 1251, flip-flop 1223, line 1304, flip-flop 1123, line 1252, flip-flop 1124, line 1305, flip-flop 1224, line 1252, flip-flop 1225, line 1306, flip-flop 1125, and so forth. The inter-die scan path 1900 crosses between the upper die 1100 and the lower die 1200 until it reaches the flip-flop 1228 in the lower die 1200. The output of the flip-flop 1228 is transmitted to the scan out 1310 to complete the inter-die scan path 1900. As discussed above, a functional path is a path included in a circuit that performs non-scan-chain-testing functions, and such a functional path is not dedicated to the scan chain wrapper cell structure. Functional paths 1302, 1303, 1304, 1305, 1306, 1307, 1308 and 1309 are embedded in the shift path of scan path 1900. CLK1 and CLK2 are kept the same and synchronized during the scan. According to some embodiments, the shift clock frequency is swept during scan chain testing, to check timing-related defects caused by weak short or opens and DC defects. According to some embodiments, the clock frequencies CLK1 and CLK2 are swept through a range from 50 MHz to 2 GHz during scan chain testing. According to some embodiments, dummy connections are added to form a continuous chain of wrapper cells between the upper and lower dies, effectively forming a single shift register that is used during scan chain testing. According to some embodiments, testing is performed through shift operation at several different clock frequencies. Each time the clock is changed to a new frequency, a new clock leading edge occurs. Each flip-flop can use the leading edge of this new clock to trigger a capture. At the leading edge of this new clock, the flip-flops output the captured value from their respective D inputs to their respective Q outputs, shifting the data along the shift path. As a result, there is no requirement for a separate capture function to trigger the capture by setting scan enable (SE=0). According to some embodiments, scan chain test patterns are generated, for example, by a general purpose processor programmed to execute a program such as an automatic test pattern generator (ATPG). If the scan chain test fails at low speed, then a hard defect is detected. If the scan chain test fails at high speed, then a resistive or weak defect is detected. According to some embodiments, a speed lower than 50 MHz is considered as low speed, the range between 50 MHz and 500 MHz is considered as high speed, 500 MHz and above is considered very high speed. If the 3DIC fails the DC test, this is an indication that the 3DIC contains at least one hard open circuit or short circuit defect. If the 3DIC passes the DC test, then the AC test is performed at a first frequency. If the 3DIC passes the AC test at the first frequency, the shift frequency is increased and the AC test is repeated. One or more iterations of the shift frequency increase and testing are repeated, until the 3DIC fails the AC test. The maximum frequency at which the 3DIC passes the scan chain test. The presence of AC defect is computed by correlating the measured passing frequency and expected shift frequency. Test or shift frequency is the speed at which data is transferred from the bottom die 1200 to the top die 1100 through the interconnections or the functional paths. As a result, the maximum passing shift frequency reflects the actual speed of the interconnections, or the functional path. FIG. 2A is a schematic diagram of a serial cross-bar scan architecture with D flops and scan flops in accordance with some embodiments. The schematic diagram in FIG. 2 has the same sequence of connections 2302-2308 as shown in the embodiment in FIG. 1, but the embodiment of FIG. 2 has two different kind of flip-flops. Flip-flops 2121, 2123, 2125, 2127, 2222, 2224, 2226 and 2228 are D flops, while flops 2122, 2124, 2126, 2128, 2221, 2223, 2225 and 2227 are "scan flip-flops." The scan flip-flops 2800 of FIG. 2 all include a regular D flip-flop 2801 and a multiplexer 2802, as shown in FIG. 2B. The scan flops are used for inter-die scan testing and the D flops are used for intra-die scan testing. The scan chain follows the same shift path as the implementation in FIG. 1. The details of the D flops and the scan flops are illustrated in FIG. 2B.

FIG. 2B is a schematic illustration of a scan flip-flop, and FIG. 2C is a schematic illustration of a D flop in accordance with some embodiments. The scan flip-flop 2800 includes a regular D flip-flop 2801 and a multiplexer 2802. The multiplexer 2802 has two inputs: the scan input 2803 and the functional path input 2804. The output 2805 of the multiplexer 2802 is transmitted to the D flip-flop 2801, the output 2806 of the D flip-flop is transmitted to another die by way of one or more conductive vias and/or one or more conductive pads (not shown). In comparison, D flip-flop 2901 receives a functional path signal from a path included in a functional circuit, which is located on another die, by way of an input 2902 and the D flip-flop 2901 has an output 2903. A functional circuit is a circuit in one of the dies that performs a function and is not exclusively used during scan chain testing operations.

Figure 3:
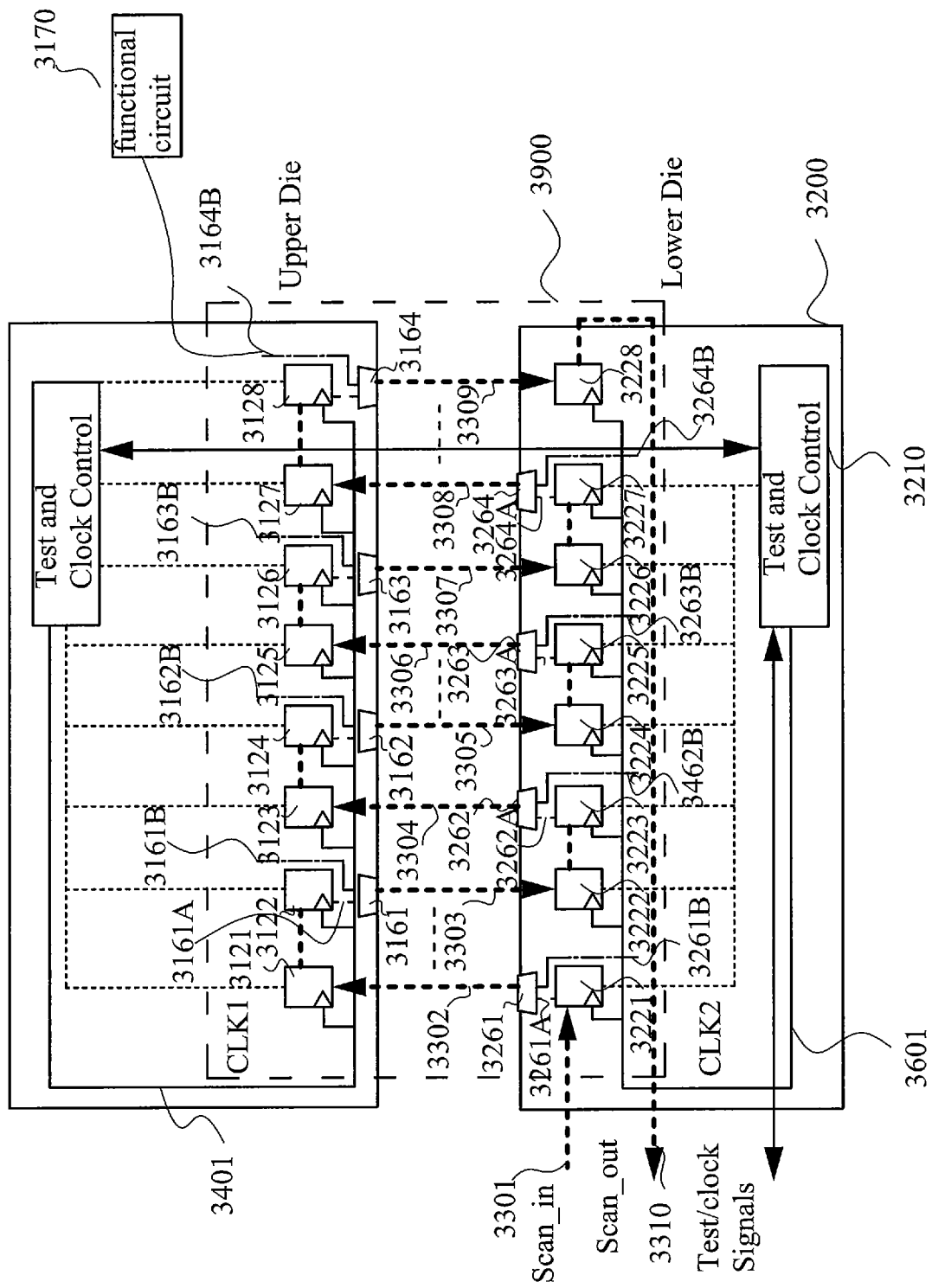
FIG. 3 is a schematic diagram of a serial cross-bar scan architecture with D flip-flops and multiplexers in accordance with some embodiments.

FIG. 3 is a schematic diagram of a serial cross-bar scan architecture with D flops and multiplexers in accordance with some embodiments. The embodiment in FIG. 3 is similar to the embodiment in FIG. 1, except that in the embodiment of FIG. 3, multiplexers are used to select either a functional path signal from a connecting path with a functional circuit in the same die as the flip-flop or a scan chain value output from the flip-flop. The value selected by the multiplexer is then provided to the other die.

According to some embodiments, a multiplexer 3161 is inserted at the output of the flip-flop 3122. One input 3161A of the multiplexer 3161 receives the output of the flip-flop 3122, the other input 3161B of the multiplexer 3161 receives a signal from a functional path of a functional circuit 3170 within the upper die 3100. The output of the multiplexer 3161 is transmitted through inter-die functional path 3303 to flip-flop 3222 in the lower die 3200. Similarly, multiplexers 3162, 3163 and 3164 are inserted at the outputs of respective flops 3124, 3126 and 3128 in the upper die 3100, and multiplexers 3261, 3262, 3263 and 3264 are inserted at the outputs of the respective flops 3221, 3223, 3225 and 3227 in the lower die 3200. The multiplexer inputs 3161B, 3162B, 3163B and 3164B are all connected to a functional path of a functional circuit in the upper die 3100, the functional circuit 3170. Similarly, the multiplexers' inputs 3261B, 3262B, 3263B and 3264B in the lower die 3200 are all connected to another functional circuit (not shown) in the lower die 3200. The scan path 3900 of the scan chain is indicated by a dashed line.

Figure 4:
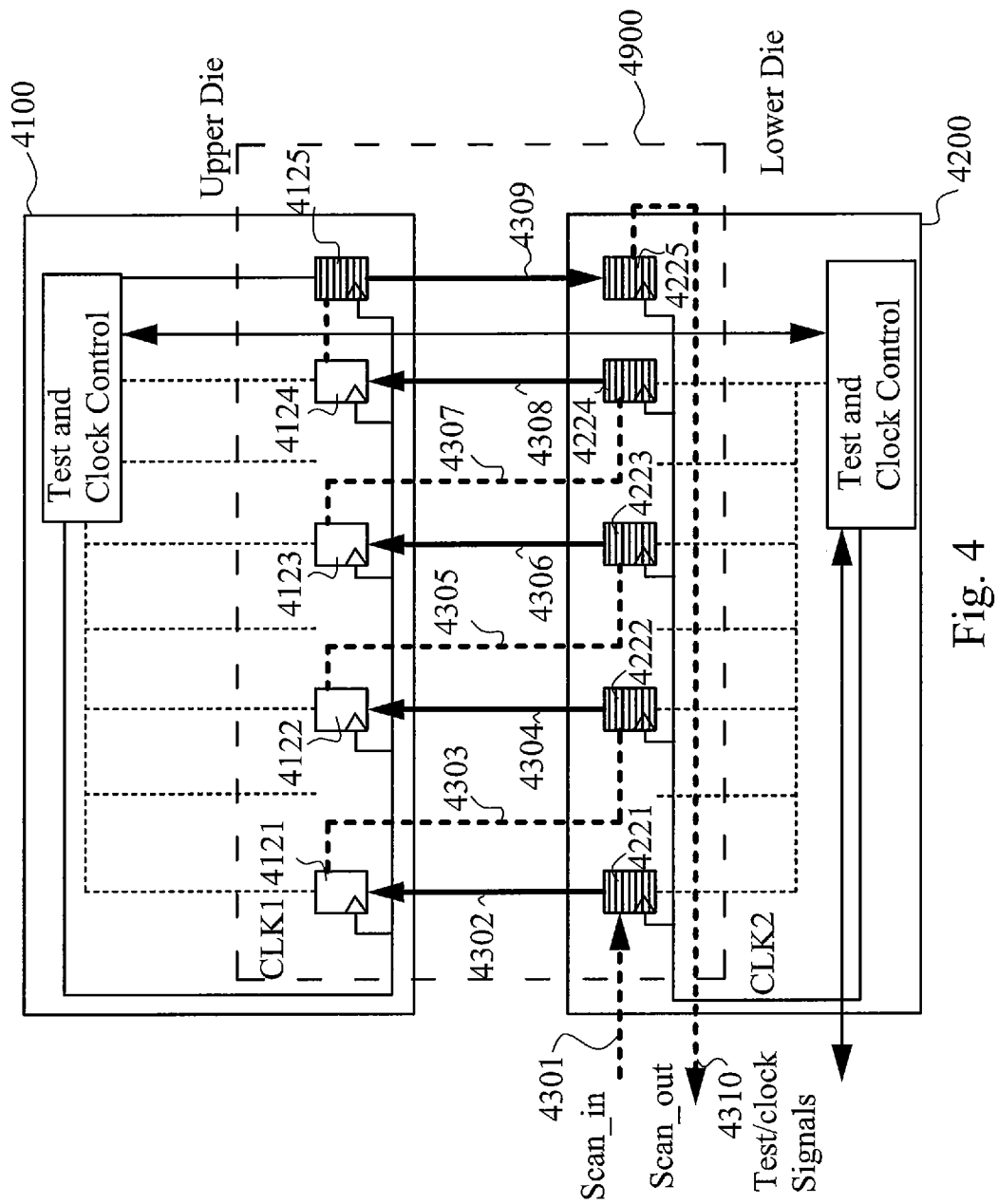
FIG. 4 is a schematic diagram of a scan architecture with non-equal number of inputs and outputs between dies in accordance with some embodiments.

FIG. 4 is a schematic diagram of a serial cross-bar scan architecture with non-equal number of inputs and outputs between dies in accordance with some embodiments. For example, the upper die 4100 and lower die 4800 can be of different types. In an example, shown in FIG. 4, the upper die 4100 has one inter-die output 4309 illustrated in solid line, but the lower die 4800 has four inter-die outputs 4302, 4304, 4306, 4308 illustrated in solid lines. Compared to FIG. 1, there are only five flops in the upper die, four of which are D flops (i.e., 4121, 4122, 4123 and 4124) receiving inputs from lower die; the fifth flip-flop 4125 of the upper die is a scan flip-flop which provides an output to the lower die. The lower die has five corresponding flops, four of which are scan flops (i.e., 4221, 4222, 4223 and 4224) providing outputs to corresponding D flops (i.e., 4121, 4122, 4123 and 4124) in the upper die; The fifth flip-flop 4225 in the lower die is a D flip-flop receiving an input from scan flip-flop 4125 in the upper die.

In some embodiments, as shown in FIG. 4, dummy interconnects 4303, 4305 and 4307 (illustrated in dashed lines) are added to enable flow of scan chain test data between the upper die and the lower die. According to some embodiments, dummy connections are added to form a continuous chain of wrapper cells between the upper and lower dies, effectively forming a single shift register that is used during scan chain testing. A dummy connection is an interconnection provided for scan chain testing, but not used by any functional circuits during other operations (besides scan chain testing). Because the dummy interconnections between die are only used during scan chain testing (but not during normal operations), the adjacent wrapper cells providing signals to the dummy interconnections do not use multiplexers to select between a test pattern input signal and a functional path input signal. The adjacent wrapper cells providing signals to the dummy interconnections can contain a latch without a multiplexer. The dummy interconnects 4303, 4305, and 4307 allow the flip-flops 4121-4125 and 4201-4205 to operate as a shift register during scan-chain testing. The scan path 4900 of the scan chain is illustrated by arrows in FIG. 4, and includes, in order, flip-flops 4201, 4121, 4222, 4122, 4223, 4123, 4224, 4124, 4125 and 4225.

Figure 5:
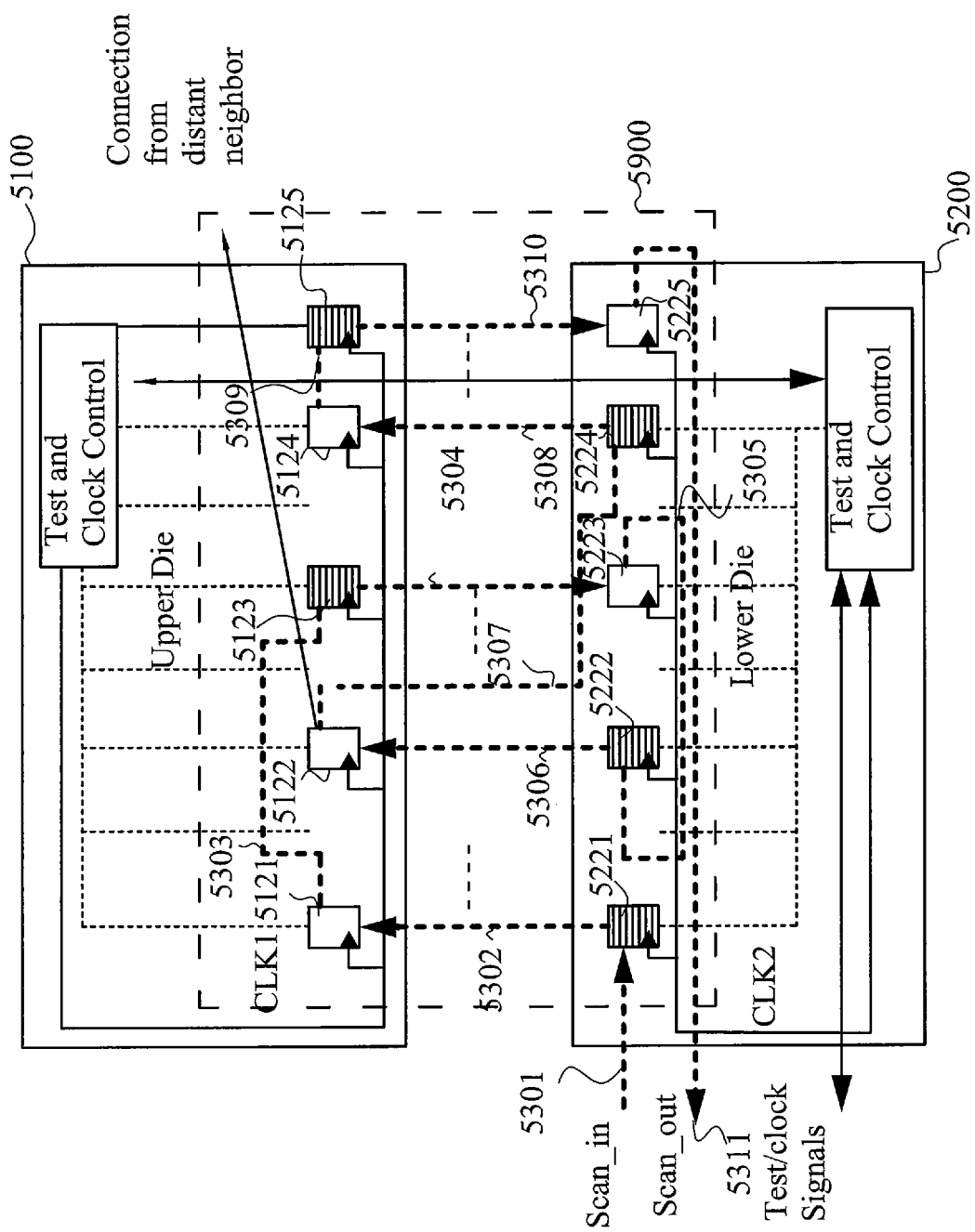
FIG. 5 is a schematic diagram of a scan architecture with connections between flip-flops which are within the same die but not adjacent to each other in accordance with some embodiments.

FIG. 5 is a schematic diagram of a scan architecture with connections between flip-flops which are within the same die but not adjacent to each other, in accordance with some embodiments. There are three D flops (5121, 5122 and 5124) in the upper die 5100 for receiving inputs from corresponding scan flops (i.e., 5221, 5222, 5224) in the lower die 5200. There are two scan flip-flops (5123 and 5125) in the upper die 5100 for sending outputs to the corresponding D flip-flops (5223 and 5225) in the lower die 5200. In this case, the flip-flop immediately adjacent to the D flip-flop 5121 within the upper die 5100 is another D flip-flop 5122. In some 3DIC designs it may be impractical or undesirable for the designer to insert a dummy interconnect to direct the output of D flip-flop 5121 to the adjacent scan flip-flop 5222 in the lower die 5200. Using a method as shown in FIG. 5, the output 5303 of the D flip-flop 5121 can be directed to a non-adjacent scan flip-flop (e.g., 5123) in the upper die, such that the output 5304 of the non-adjacent flip-flop 5123 crosses to the lower die 5200 and is connected to a D flip-flop 5223 in the lower die 5200. Similarly, the output 5305 of the D flip-flop 5223 is directed to a scan flip-flop 5222 in the lower die 5200. The output 5306 of the scan flip-flop 5222 then crosses to the upper die 5100 and connects to a D flip-flop 5122. The output 5307 of the D flip-flop 5122 crosses to the lower die 5200 again the connects to a non-adjacent scan flip-flop 5224 in the lower die 5200. The shift path then continues to cross to the upper die 5100 through 5308 to reach D flip-flop 5124, then through 5309 to scan flip-flop 5125. After crossing to the D flip-flop 5225 in the lower die 5200 through 5310, the shift path completes with scan out 5311. The scan path 5900 of the scan chain is illustrated with dashed line. The scan path 5900 includes, in order, flip-flops 5221, 5121, 5123, 5223, 5222, 5122, 5224, 5124, 5125 and 5225.

Figure 6:
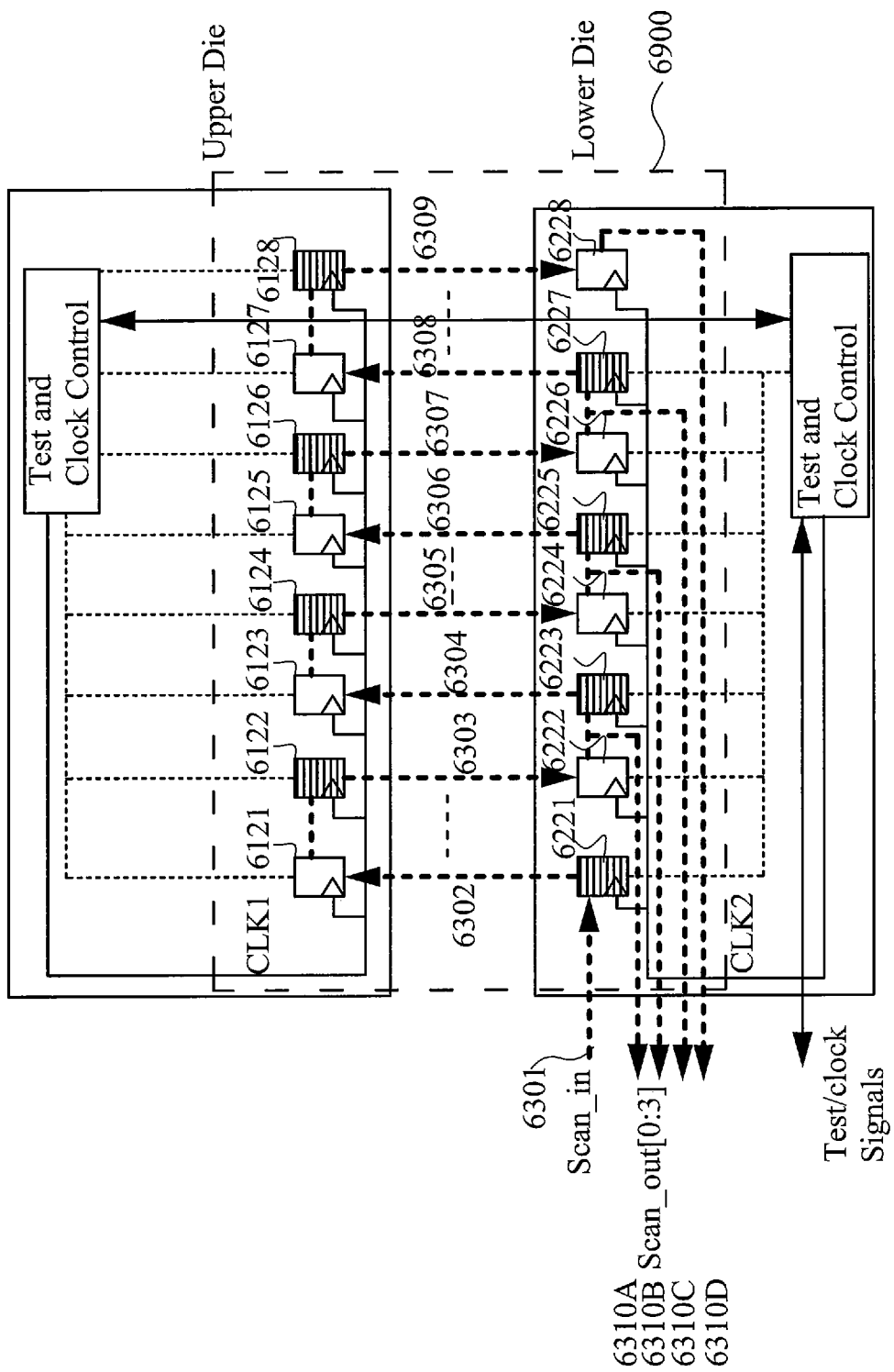
FIG. 6 is a schematic diagram of a scan architecture with multiple scan outputs in accordance with some embodiments.

FIG. 6 is a schematic diagram of a scan architecture with multiple scan outputs in accordance with some embodiments. The embodiment in FIG. 6 is similar to the embodiment in FIG. 2A except that instead of having only one scan out 2310, there are four different taps for scan outputs 6310A, 6310B, 6310C and 6310D. The first scan output 6310A is taken from the path between the D flip-flop 6222 and the scan flip-flop 6223, the second scan out 6310B is taken from the path between the D flip-flop 6224 and the scan flip-flop 6225, the third scan out 6310C is taken from the path between the D flip-flop 6226 and the scan flip-flop 6227, and finally the fourth scan out 6310D is taken from the output of the D flip-flop 6228. Multiple scan outputs permit the user of a larger variety of fault diagnosis algorithms, to identify the specific location of a defect. The scan path 6900 of the scan chain is illustrated with dashed line, and is the same as that discussed above with reference to FIG. 2A.

Figure 7:
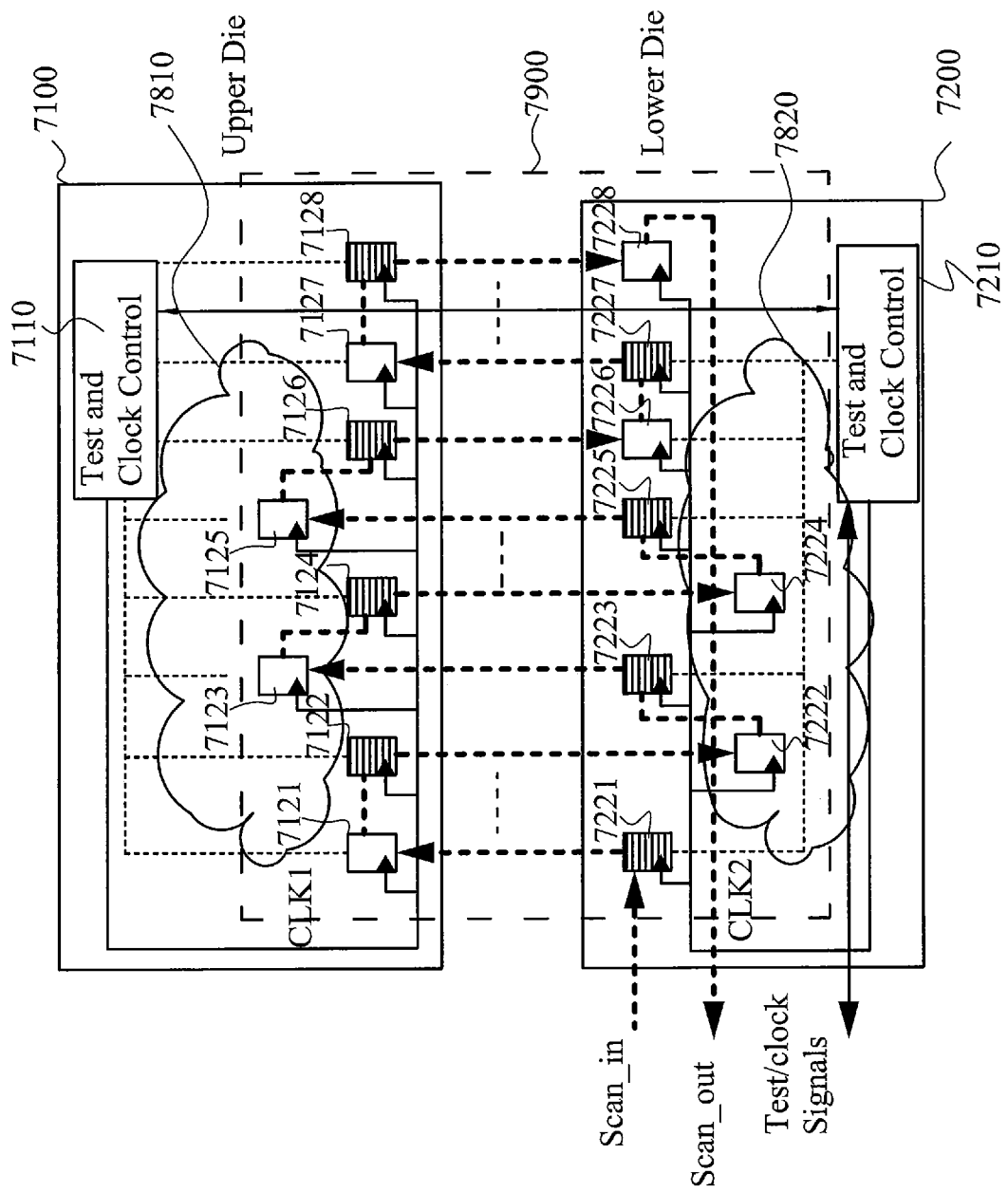
FIG. 7 is a schematic diagram of a scan architecture with shared functional flip-flops in accordance with some embodiments.

FIG. 7 is a schematic diagram of a scan architecture with shared functional flip-flops in accordance with some embodiments. The embodiment in FIG. 7 is similar to the embodiment in FIG. 2A except that intra-die flip-flops 7123, 7125, 7222 and 7224 are "shared functional flip-flops" rather than dedicated D flip-flops. A shared functional flip-flop is used during scan chain testing, and is also used by a functional circuit within one of the dies while that die is performing an operation other than scan chain testing. The D flip-flops 7123 and 7125 are part of a functional circuit 7810 in the upper die. The D flip-flops 7222 and 7224 are part of a logic unit 7820 in the lower die. The intra-die flops 7123, 7125, 7222 and 7224 are not dedicated for scan chain testing. Instead, each of the flip-flops 7123, 7125, 7222 and 7224 are included in separate logic circuitry (e.g., in their own logic units 7810 and 7820 respectively). Sharing flops for use both during scan chain testing and during normal operation is usually possible from a functional point of view, but providing dedicated flip-flops for scan chain testing may simplify routing in some IC designs. In some embodiments, flip-flop sharing as shown in FIG. 7 can be used to reduce die size, for example. The scan path 7900 of the scan chain in FIG. 7 is illustrated with dashed line, and includes, in order, flip-flops 7221, 7121, 7122, 7222, 7223, 7123, 7124, 7224, 7225, 7125, 7126, 7226, 7227, 7127, 7228, and 7128.

Figure 8:
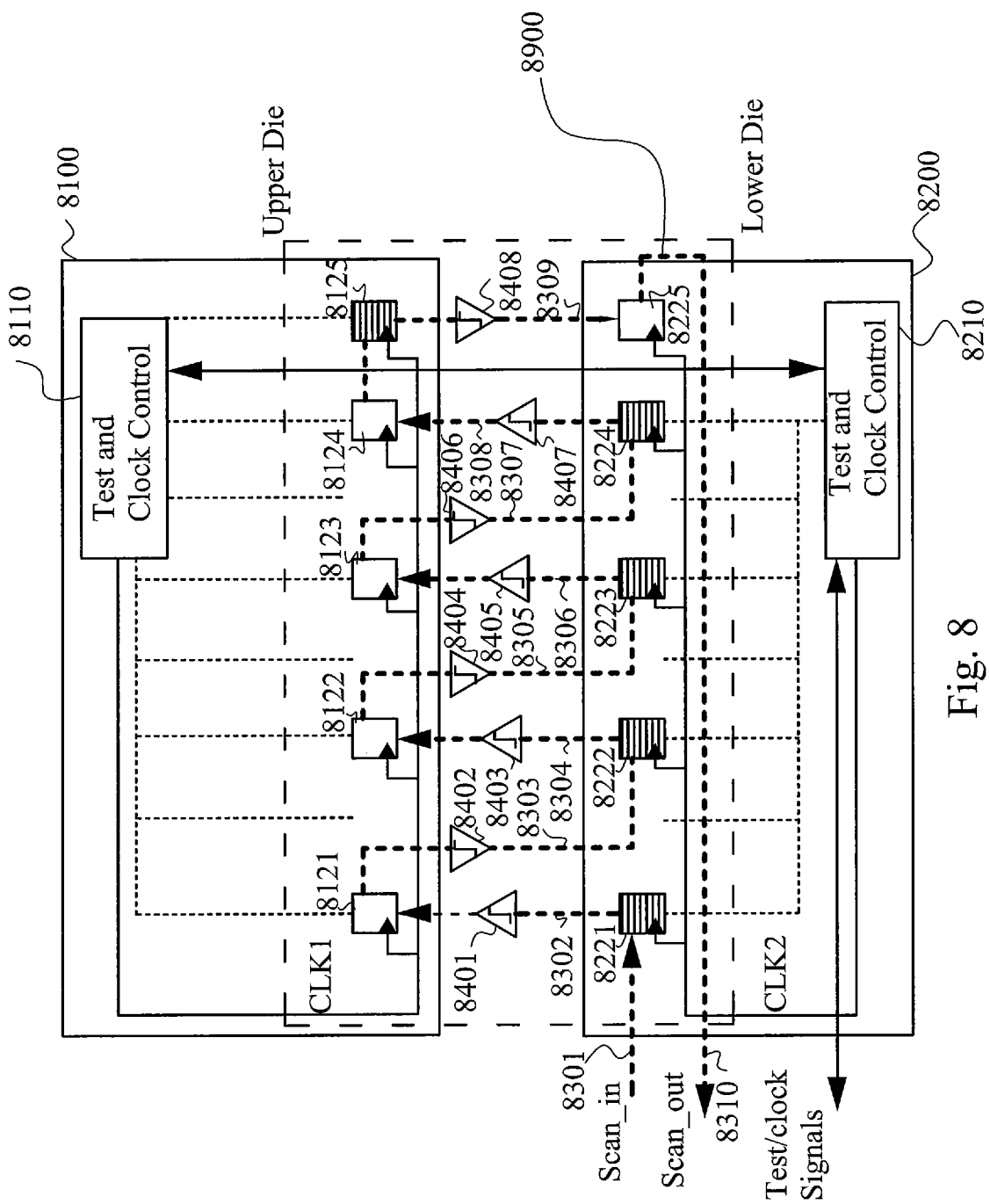
FIG. 8 is a schematic diagram of a scan architecture with level shifters in accordance with some embodiments.

FIG. 8 is a schematic diagram of a scan architecture with level shifters in accordance with some embodiments. The embodiment in FIG. 8 is similar to the embodiment in FIG. 4, with four D flip-flops, 8121, 8122, 8123 and 8124, in the upper die 8100 for receiving inputs from scan flip-flops, 8221, 8222, 8223 and 8224, respectively, in the lower die 8200, and a scan flip-flop 8125 in the upper die 8100 for sending signal to the D flip-flop 8225 in the lower die 8200. The scan path 8900 is similar to the scan path 4900 in FIG. 4, and includes flip-flops 8221, 8121, 8222, 8122, 8223, 8123, 8224, 8124, 8125 and 8225. The difference is that eight level shifters 8401, 8402, 8403, 8404, 8405, 8405, 8407 and 8408 are inserted along the scan path 8900 in the connections between the upper die and the lower die. Although the level shifters 8401-8408 are shown schematically between the dies 8100 and 8200, the individual level shifters can be included within the upper die 8100 and/or the lower die 8200. The implementation of level shifters between the upper die and the lower die permits inclusion of dies having two or more different voltage levels within the same 3DIC. When the upper die and the lower die implement different technologies, their voltage levels may differ. According to some embodiments, with level shifters, an upper die and lower die of different technologies can be stacked within the same 3DIC. Level shifters can be included in any of the embodiments from FIG. 1 through FIG. 7. The scan path 8900 of the scan chain is illustrated with dashed line, and includes the flip-flops 8221, 8121, 8222, 8122, 8223, 8123, 8224, 8124, 8125, and 8225.

Figure 9A:
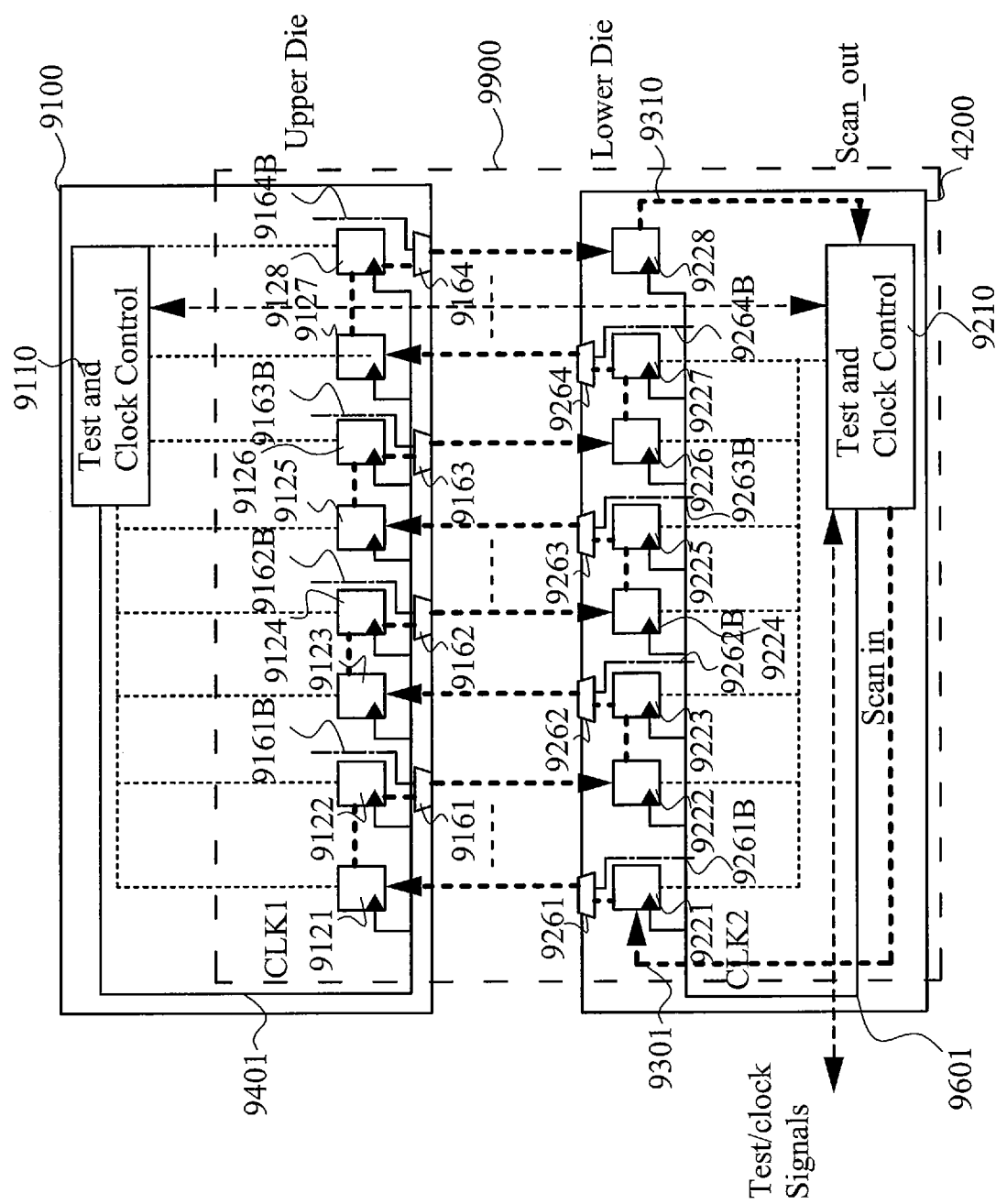
FIG. 9A is a schematic diagram of a scan architecture with on-chip test generation and comparison in accordance with some embodiments.

FIG. 9A is a schematic diagram of a scan architecture with on-chip scan chain test data generation and comparison in accordance with some embodiments. The embodiment in FIG. 9 is similar to the embodiment in FIG. 3A, with eight flops, 9121, 9122, 9123, 9124, 9125, 9126, 9127 and 9128 in the upper die 9100, and eight flops, 9221, 9222, 9223, 9224, 9225, 9226, 9227 and 9228 in the lower die 9200. The test and clock control unit 9210 is different from the test and clock controls 3110 and 3210. Instead of receiving tests from scan in 3301 from outside the upper and the lower dies, according to some embodiments as shown in FIG. 3A, test patterns are generated inside the test and clock control unit 9210 in the die including the first flip-flop in the scan chain shift pattern (e.g., the lower die 9200 in the example of FIG. 9). The scan chain test data sequence is generated on-chip and then transmitted to the first flip-flop through interconnection 9301. Then a scan path similar to scan path 3900 is followed, and the scan output 9310 is transmitted into the test and clock control unit 9210 where a comparison can be conducted on-chip. According to some embodiments, the on-chip test generation and comparison facilitates scan chain testing without external test generation and comparison. In other embodiments, external test generation and comparison can reduce the time for test generation and comparison. The on-chip test generation and comparison can be implemented to any of the embodiments in FIG. 1 through FIG. 8. Scan path 9900 of the scan chain is illustrated with dashed line, and includes flip-flops 9221, 9121, 9122, 9222, 9223, 9123, 9124, 9224, 9225, 9125, 9126, 9226, 9227, 9127, 9128, and 9228.

Figure 9B:
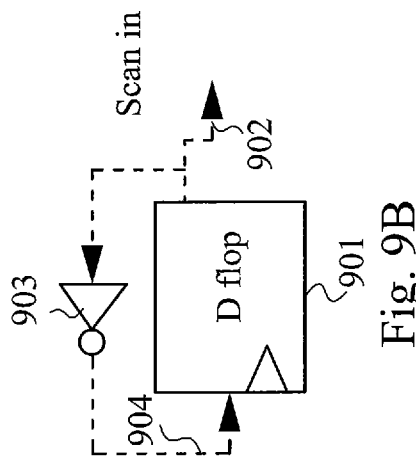
FIG. 9B is a schematic diagram of a test pattern generator for on-chip test generation in accordance with some embodiments.

FIG. 9B is a schematic diagram of a test pattern generator for on-chip test generation in accordance with some embodiments. The D flip-flop 901 has an output 902, which is fed to the input of an inverter 903. The output 904 of the inverter is fed back to the input of the D flip-flop 901. The output 902 can be used as the scan input 9301 in FIG. 9A. In other embodiments, other test pattern generators are used.

Figure 9C:
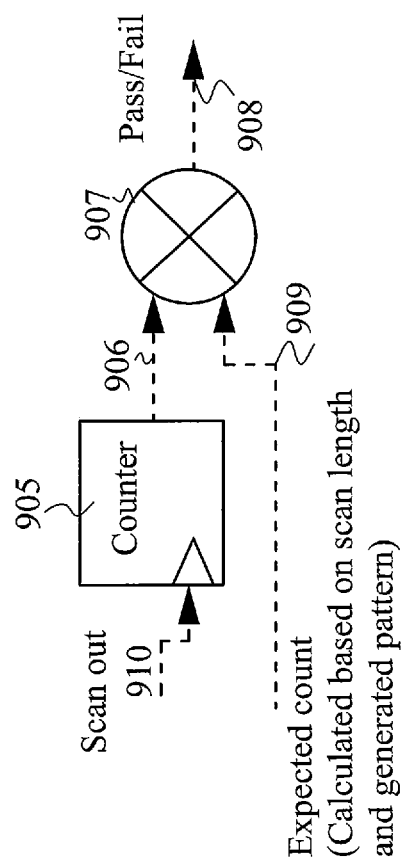
FIG. 9C is a schematic diagram of a test response comparison unit for on-chip test generation and comparison in accordance with some embodiments.

FIG. 9C is a schematic diagram of a test response comparison unit for on-chip test generation and comparison in accordance with some embodiments. The scan output 910 is fed through the counter 905 as an input 906 to the comparator 907. The other input 909 of the comparator 907 is calculated based on scan length and the generated pattern. The values of input 906 and input 909 are compared in the comparator 907, and the output 908 indicates whether the 3DIC passes or fails the scan chain test.

The embodiments in FIG. 1 through 9C can be combined with each other, the inclusion of one embodiment does not exclude the other embodiments. Although the examples described above include two dies for simplicity of illustration, the methods and structures described herein can be applied to 3DICs including more than two dies (e.g., four, six, or eight dies).

Figure 10:
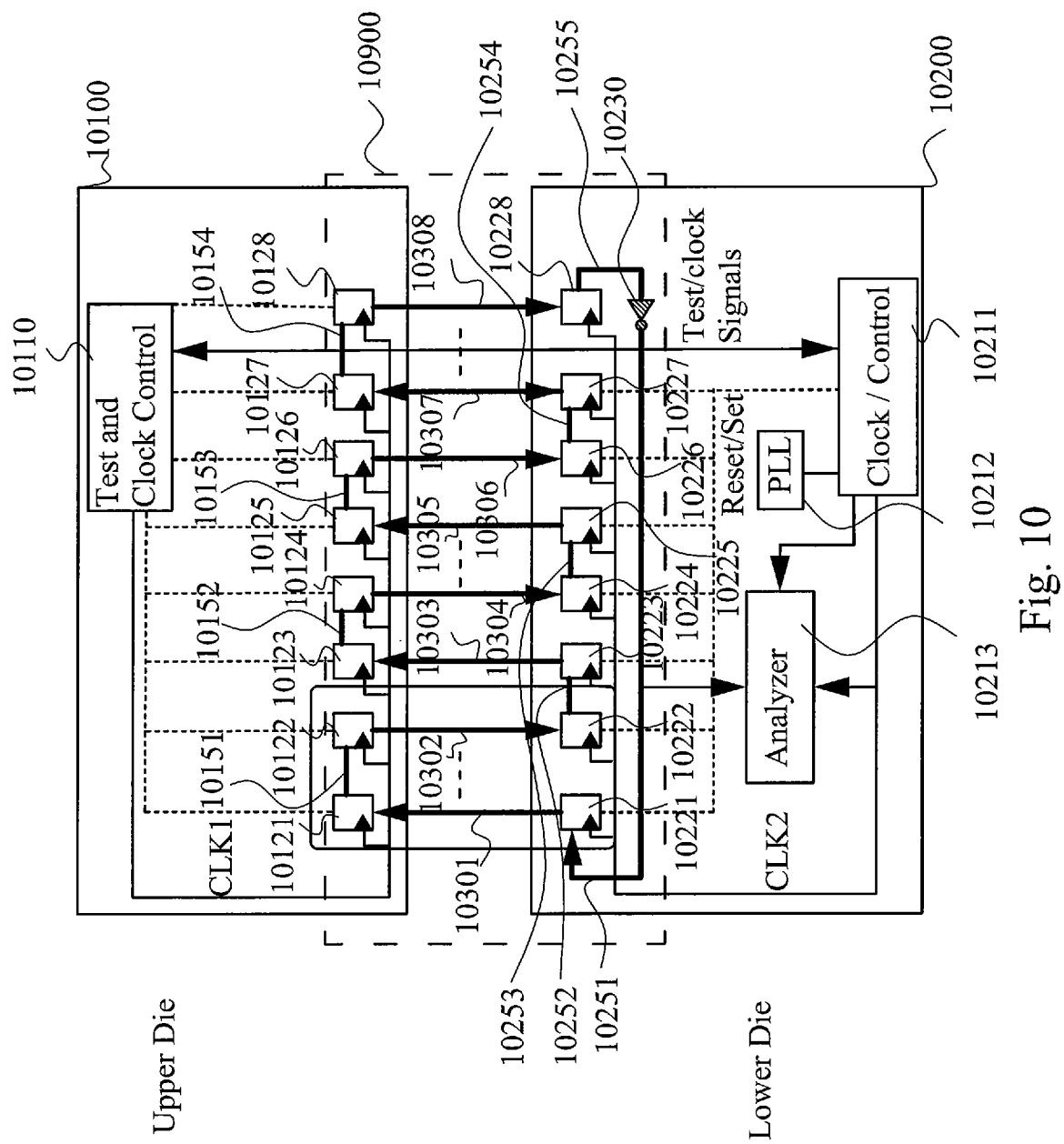
FIG. 10 is a schematic diagram of a deterministic circular built-in self-test architecture in accordance to some embodiments.

FIG. 10 is a schematic diagram of a deterministic circular built-in self-test architecture in accordance with some embodiments. The embodiment in FIG. 10 is similar to the embodiment in FIG. 9A. The upper die 10100 is stacked on the top of the lower die 10200. According to some embodiments, there are eight flip-flops (10121, 10122, 10123, 10124, 10125, 10126, 10127 and 10128) implemented in the upper die 10100, and there are eight flip-flops (10221, 10222, 10223, 10224, 10225, 10226, 10227 and 10228) in the lower die 10200. The eight flip-flops in the upper die 10100 and the eight flip-flops in the lower die 10200 are inter-connected in a similar fashion to those flip-flops shown in FIG. 9A. The test and clock control unit 10110 in the upper die 10100 is connected to the eight flip-flops in the upper die in a similar fashion to that of FIG. 9A. The difference between FIG. 10 and FIG. 9A is in the lower die 10200. The output 10255 of the eighth flip-flop 10228 in the lower die 10200 is connected to an inverter 10230. The output signal from flip-flop 10228 is inverted by the inverter 10230 and is then transmitted to two different places: first, the inverted signal 10251 is transmitted back to the input of the first flip-flop 10221 of the lower die 10200; second, the inverted signal 10251 is transmitted to the analyzer unit 10213 in the lower die 10200.

The test and clock control unit 10110 of the upper die 10100 is connected to the clock control unit 10211 in the lower die 10200. The phase lock loop (PLL) unit 10212 controls the clock and control unit 10211. The output of the clock and control unit 10211 is also transmitted to the analyzer unit 10213 in the lower die 10200. The clock and control unit 10211 transmits clock signal to each of the eight flip-flops in the lower die 10200. The clock and control unit 10211 also transmits set and rest signals to each of the eight flip-flops in the lower die 10200. The set and rest signals are implemented to initialize the flip-flops. The analyzer unit 10213 accepts signals from the flip-flop scan chain and the clock and control unit 10211 to perform analytical tasks to diagnose the types of the faults present in the flip-flop scan chain and to locate such faults therein. The scan path 10900 includes a continuously connected set of latches and interconnections between and within dies, for shifting data from the scan input to the scan output. According to some embodiments, the scan path 10900 includes flip-flop 10221, interconnect 10301, flip-flop 10121, connect 10151, flip-flop 10122, interconnect 10302, flip-flop 10222, connect 10252, flip-flop 10223, interconnect 10303, flip-flop 10123, connect 10152, flip-flop 10124, interconnect 10304, flip-flop 10224, connect 10253, flip-flop 10225, interconnect 10305, flip-flop 10125, connect 10153, flip-flop 10126, interconnect 10306, flip-flop 10226, connect 10254, flip-flop 10227, interconnect 10307, flip-flop 10127, connect 10154, flip-flop 10128, interconnect 10308, flip-flop 10228, output 10255, inverter 10230 that inverts the output signal, and connect 10251 that feed the inverted output to the input of the first flip-flop 10221 for form a scan path. The details of the analyzing and diagnosing steps will be discussed below.

Figure 11:
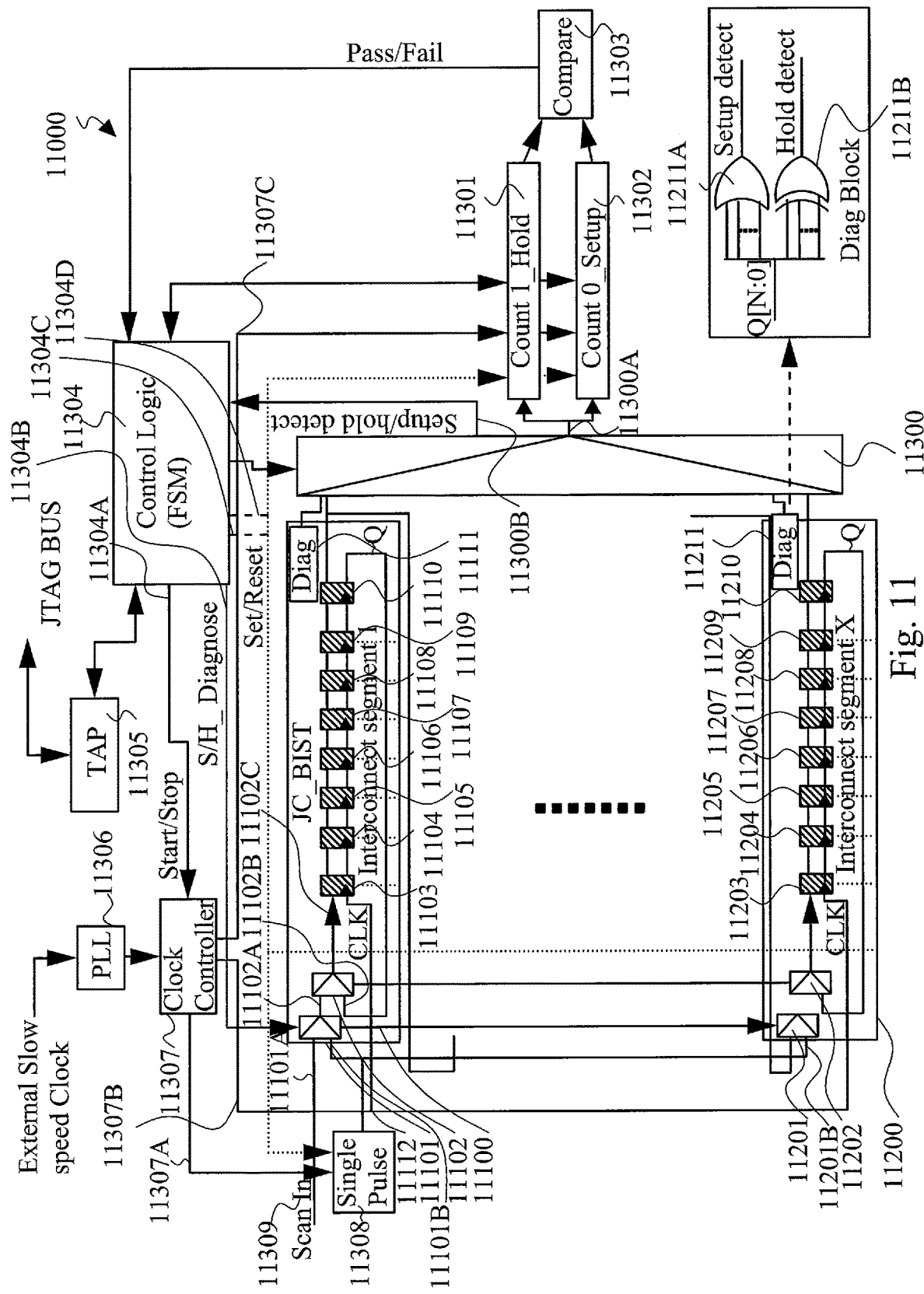
FIG. 11 is a block diagram of a deterministic circular built-in self-test architecture in accordance with some embodiments.

FIG. 11 is a block diagram of a deterministic circular built-in self-test architecture in accordance with some embodiments. The deterministic circular built-in self-test architecture 11000 includes a plurality of interconnect segments, labeled as interconnect segment 1 (11100), through interconnect segment X (11200). The deterministic circular built-in self-test architecture 11000 also includes a multiplexer 11300, a first counter unit 11301 for counting the number of hold violations, a second counter unit 11302 for counting the number of setup violations, a compare unit 11303 for comparing the output of the first counter unit 11301 and the output of the second counter unit 11302. According to some embodiments, a hold violation happens when the flip-flop holds the old value and cannot change from 1 to 0, or from 0 to 1 when it is supposed to change. According to some embodiments, a setup violation happens when the new data comes to a flip-flop earlier than the new data is supposed to be there. The deterministic circular built-in self-test architecture 11000 further includes a control logic unit 11304, a test access port (TAP) unit 11305, a phase lock loop (PLL) unit 11306, a clock controller 11307, and a single pulse unit 11308. The TAP unit 11305 is connected to a JTAG bus. A STAG bus is the Standard Test Access Port and Boundary Scan Architecture according to IEEE standard 1149.1.

The first interconnect segment 11100 includes a first multiplexer 11101, a second multiplexer 11102, a plurality of flip-flops 11103, 11104, 11105, 11106, 11107, 11108, 11109, 11110, and a diagnosis unit 11111. According to some embodiments, the first input 11101A of the first multiplexer 11101 is connected to the scan-in signal 11309, and the second input 11101B of the first multiplexer 11101 is connected to the second inputs of all subsequent interconnect segments, up to the second input 11201B of the first multiplexer 11201 of the Xth interconnected segment 11200. The output of the first multiplexer 11101 is connected to the first input 11102A of the second multiplexer 11102, and the second input 11102B of the second multiplexer 11102 is connected to the QB (QB represents "Q bar", the inversion of Q) output the last flip-flop 11110QB. The output 11102C is connected to the D input 11103D of the first flip-flop 11103, and the Q output 11103Q is connected to the D input 11104D of the subsequent flip-flop 11104. The Q output of each of the flip-flops are connected to the D input of the subsequent flip-flops in a similar way. The clock signal 11112 provide clock signal to each of flip-flops 11103, 11104, 11105, 11106, 11107, 11108, 11109 and 11110. The output 11110Q of the last flip-flop 11110 is transmitted as an input to the multiplexer 11300. The output 11110Q of the last flip-flop 11110 in the first interconnect segment 11100 is also connected to the first input of the first multiplexer in the second interconnect segment (not shown in the figure). The diagnosis unit 11111 further includes an OR gate 11111A as a setup detector, and a XOR gate 11111B as a hold detector. The detailed operations of OR gate 11111A as a setup detector, and a XOR gate 11111B as a hold detector is discussed in FIGS. 21 and 22.

All subsequent interconnect segments up to interconnect segment X 11200 are configured similarly to the interconnect segment 1 11100. The second inputs of the first multiplexers of the plurality of interconnect segments from 1 to X are connected together. The Q outputs of the last flip-flops in each of the plurality of flip-flops are transmitted to the multiplexer 11300 as inputs in a similar way to 11110Q. The output of the diagnosis units are also connected to the multiplexer 11300 in a similar way to diagnosis unit 11111. The Q outputs of the last flip-flops of each of the interconnect segment (except the last interconnect segment X) is connected to the first input of the first multiplexer in the subsequent interconnect segment.

The output 11300A is transmitted to both the first counter unit 11301 and the second counter unit 11302 for counting hold setup fault respectively. The output of the first counter unit 11301 and the second counter unit 11302 are transmitted to the compare unit 11303 for comparison to determine pass or fail of the test, a detailed discussion regarding the test is presented in the description of FIG. 23 in the step 2303. The output 11300B of the multiplexer 11300 is transmitted to the control logic unit 11304 for further processing. The clock control unit 11307 provides a first control signal 11307A to control the single pulse unit 11308, a second control signal 11307B to provide clock signals to all interconnect segments by connecting to the flip-flops' clock inputs in a similar way to clock signal 11112. The third control signal 11307C controls the first counter 11301 and the second counter 11302.

The control logic unit 11304 provides a start and stop signal 11304A to control the starting and stopping of the clock controller unit 11307. The control logic unit 11304 provides diagnosis signal 11304B connecting to the selector signals of the first multiplexers in each of the interconnect segment for setup and hold diagnosis. The details of the setup and hold diagnosis are discussed in the following figures. The control logic unit 11304 provides a set and rest signal 11304C to the single pulse unit 11308, the first counter unit 11301, the second counter unit 11302 and each of the flip-flops in each of the interconnect segment. The control logic unit 11304 also provides a selector signal 11304D to control the selectors of the second multiplexers in each of the interconnect segments. In addition, the control logic unit 11304 is also coupled to the first counter unit 11301, the second counter unit 11302, and the TAP unit 11305. The PLL unit 11306 accepts an external slow clock to control the clock controller 11307.

Figure 12:
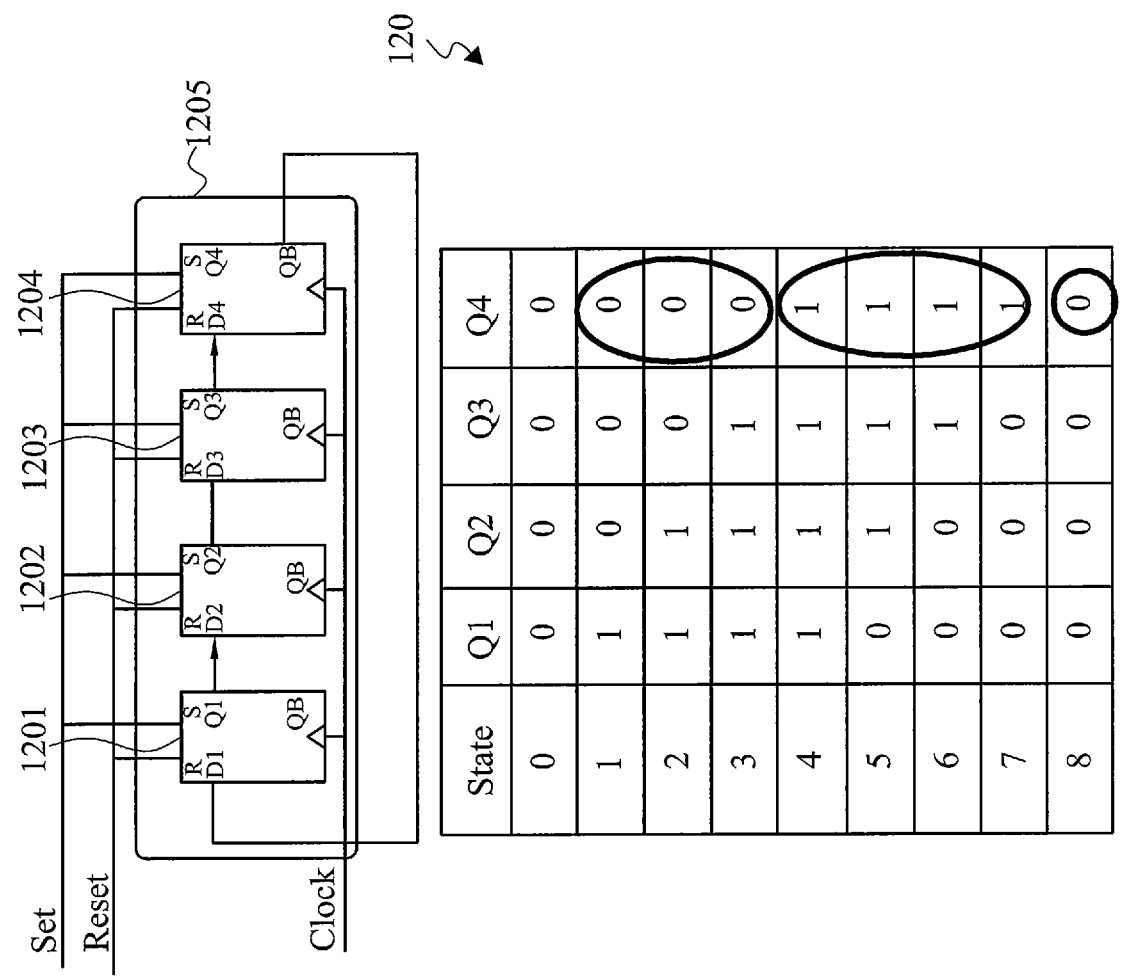
FIG. 12 is a schematic diagram of a fault free circuit of four flip-flops and its corresponding logic table in accordance with some embodiments.

FIG. 12 is a schematic diagram of a fault free circuit of four flip-flops and its corresponding logic table in accordance with some embodiments. There are four flip-flops 1201, 1202, 1203 and 1204 in the interconnect segment 1205 according to some embodiments. According to some embodiments, the interconnect segment 1205 is the first interconnect segment in FIG. 11. The first flip-flop 1201's output 1201Q(Q1) is connected to the D input 1202D of the second flip-flop 1202, the output 1202Q(Q2) is connected to the D input 1203D of the third flip-flop, the Q output 1203Q(Q3) is connected to the D input 1204D of the fourth flip-flop, the Q output of the fourth flip-flop 1204 is 1204Q (Q4). The QB output 1204QB of the fourth flip-flop 1204 is connected to the D input of the first flip-flop 1201. QB means Q-bar, or the inversion of Q. The Set signals "S" of all of the four flip-flops are connected to Set signal 11304C of the control logic unit 11304 illustrated in FIG. 11. Similarly, the Reset signal "R" of all of the four flip-flops are connected to the Reset signal 11304C of the control logic unit 11034 illustrated in FIG. 11. The clock of all of the flip-flops are controlled by the clock signal 11307B of the clock controller unit 11307 illustrated in FIG. 11.

According to some embodiments, the circuit implemented by flip-flops 1201 through 1204 is a fault-free circuit. According to some embodiments, table 120 is a table illustrating the Q output values of the flip-flops 1201 through 1204 at clock cycles 0, 1, 2, 3, 4, 5, 6, 7 and 8. According to some embodiments, for a circuit with N flip-flops, it takes 2N clock cycles to go back to its initial state, and this circuit is a 2N-state finite state machine. In FIG. 12, N=4, thus 2N=8. Accordingly, the circuit with 4 flip-flops is a finite state machine with 8 states. In Table 120, for each clock cycle 0 through 8, there are 4 Q values, Q1, Q2, Q3 and Q4 corresponding to the Q outputs of the flip-flops. At clock cycle 0, all Q values are 0, at clock cycle 8, the circuit goes back to the initial state with all Q values equal to 0. At clock cycle 1, the value 1 is shifted out on Q1; at clock cycle Q2, value ones are shifted out on Q1 and A2; at clock cycle 3, value ones are shifted out on Q1, Q2, and Q3; at clock cycle 4, value ones are shifted out on all Q's from Q1 to Q4. At clock cycle 4, four value ones are shifted to the fault free circuit 1205. Because there is no fault in the circuit 1205, it takes another 4 cycles for the circuit to return back to its initial state with all Q values equal to 0. The output sequence on Q4 during the 0 through 8 clock cycles are: 0, 0, 0, 0, 1, 1, 1, 1, 0, as illustrated in the last column in the Table 120 marked Q4. The number of zeroes and ones play a key role in the determination of the fault states of the flip-flops in the interconnect segment 1205. According to some embodiments, for a fault-free circuit with N flip-flops of 2N cycles, there are N ones and N zeroes in the Q output of the last flip-flop. In the fault-free circuit example illustrated in FIG. 12, the 8 cycles in the Q4 data has 4 zeroes and 4 ones.

Figure 13:
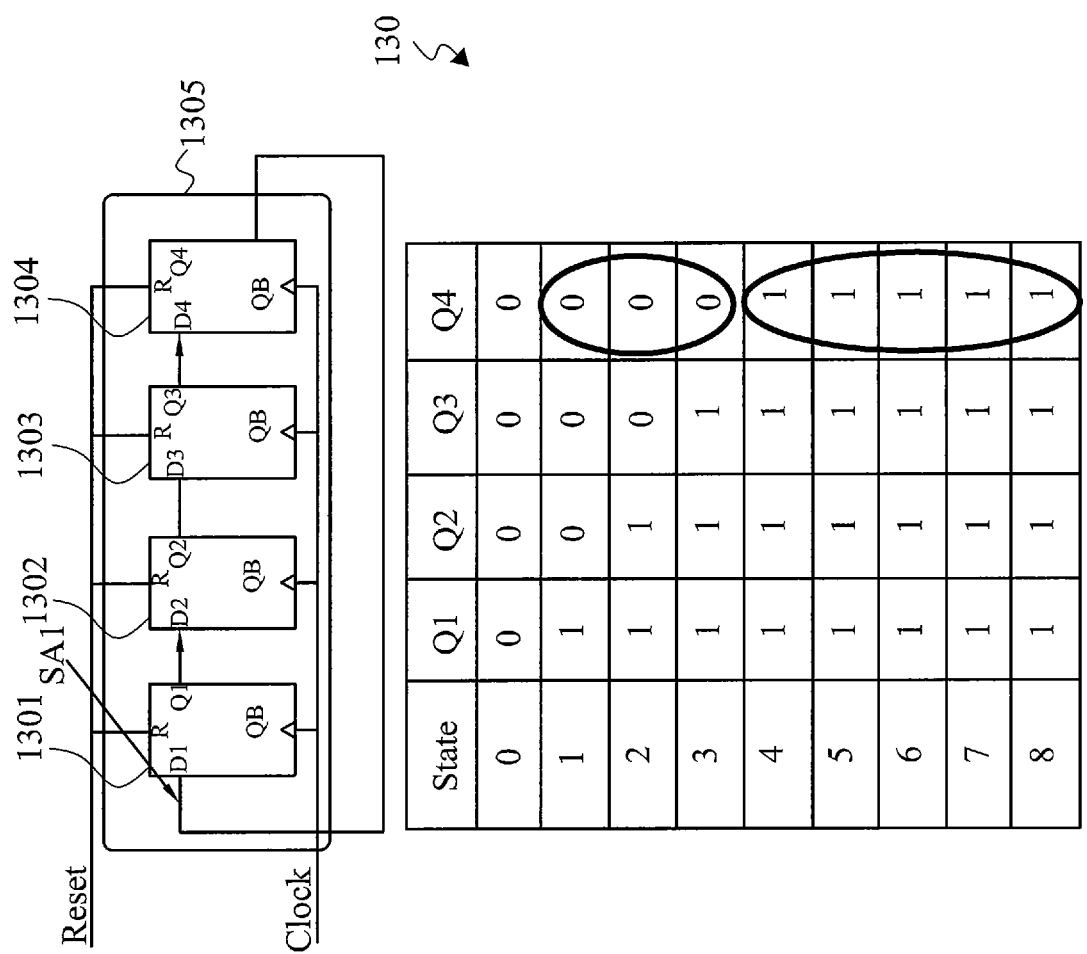
FIG. 13 is a schematic diagram of a circuit with a stuck-at-1 fault at a first location of four flip-flops and its corresponding logic table in accordance with some embodiments.

FIG. 13 is a schematic diagram of a circuit with a stuck-at-1 fault at a first location of four flip-flops and its corresponding logic table in accordance with some embodiments. FIG. 13 illustrates a similar configuration to FIG. 12, with the interconnect 1305 including four flip-flops 1301, 1302, 1303 and 1304. FIG. 13 is different from FIG. 12 in that there is a stuck-at-1 (SA1) fault at the first flip-flop 1301, as illustrated as SA1 in FIG. 13. The SA1 fault could be at D1, between D1 and Q1 or at Q1. The "Reset" signal resets the output of the flip-flops to 1 at appropriate clock cycles.

Similarly, the Table 130 illustrates the Q output states of the flip-flops 1301 through 1304 from clock cycles 0 through 8. When the circuit is not fault-free, as illustrated in FIG. 12, the circuit is no longer a finite state machine and the circuit does not go back to its initial state after 2N cycles. The number of ones and number of zeroes are no longer equal in the Q4 output from clock cycles 1 through 8. According to some embodiments, for 2N cycles, there are N−1 zeros and N+1 ones on the Q4 output. As illustrated in the Table 130, because there is an SA1 fault at flip-flop 1301, the Q output value Q1 is "stuck-at" 1, which propagates to the next flip-flop at the next clock cycle. For the rest of the 8 clock cycles, the Q1 value remains at 1. Once Q2 reaches 1, the 1 also propagates to the next flip-flop after another clock cycle. Eventually the value 1 reaches Q4 and because Q1 is "stuck at" 1, it keeps Q2, Q3 and Q4 all at the value 1 after 4 clock cycles. After 8 clock cycles, the number of ones is 4+1=5, and the number of zero's is 4−1=3.

Figure 14:
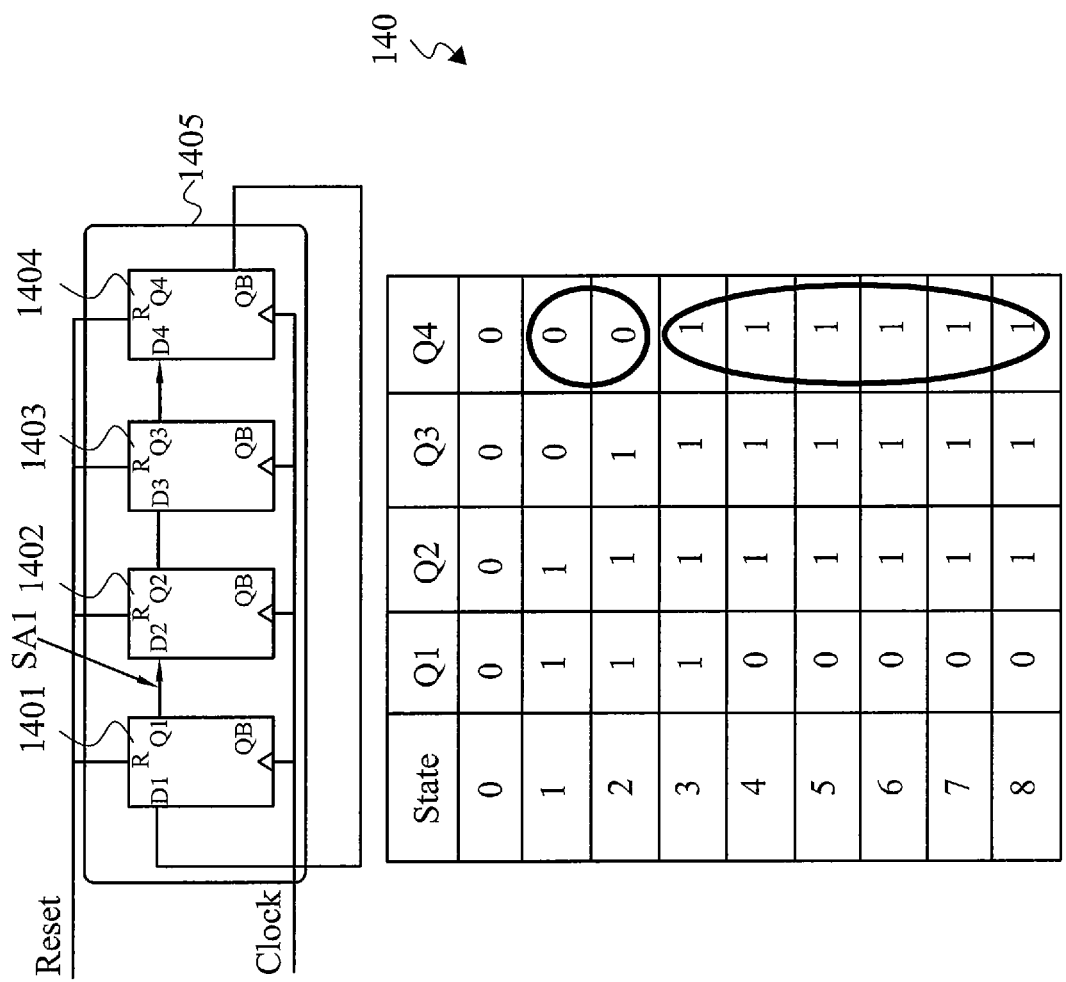
FIG. 14 is a schematic diagram of a circuit with a stuck-at-1 fault at a second location of four flip-flops and its corresponding logic table in accordance with some embodiments.

FIG. 14 is a schematic diagram of a circuit with a stuck-at-1 fault at a second location of four flip-flops and its corresponding logic table in accordance with some embodiments. FIG. 14 illustrates another similar configuration 1405 with four flip-flops 1401, 1402, 1403 and 1404, and the difference between FIG. 14 and FIG. 13 is that there is a Stuck-At-1 fault at a second location in FIG. 14.

The difference between the Tables 140 and 130 is that instead of Q1 being stuck at 1 for all 8 clock cycles, as in the Table 130, in Table 140, Q2 is stuck at 1 for all 8 clock cycles. According to some embodiments, there are N−2 zeroes and N+2 ones in the Q4 output after 2N clock cycles. Similar to FIG. 13, the configuration in FIG. 14 is not a 2N finite state machine either. According to some embodiments, when N=4, there are two (4−2=2) zero's and six (4+2=6) ones in the Q4 output.

Figure 15:
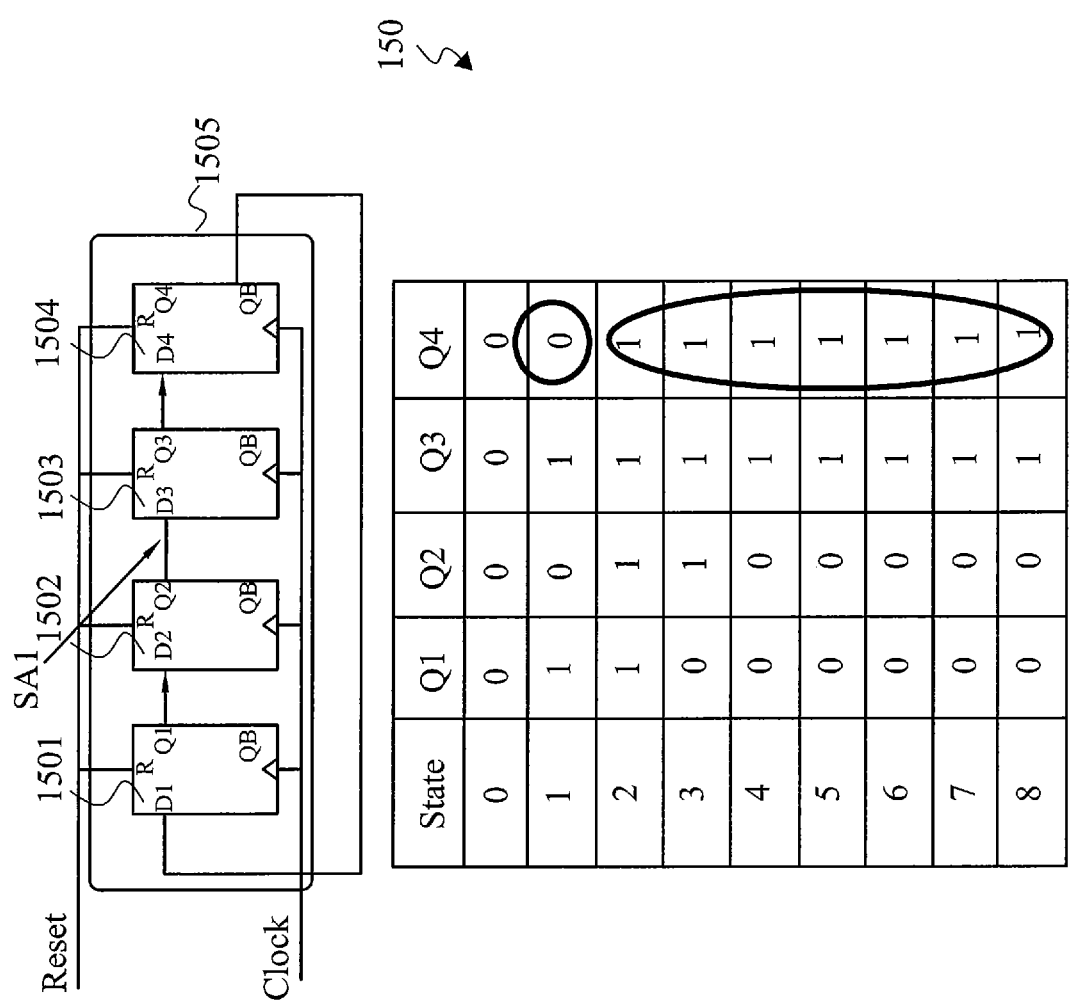
FIG. 15 is a schematic diagram of a circuit with a stuck-at-1 fault at a third location of four flip-flops and its corresponding logic table in accordance with some embodiments.

FIG. 15 is a schematic diagram of a circuit with a stuck-at-1 fault at a third location of four flip-flops and its corresponding logic table in accordance with some embodiments. Another stuck-at-1 fault at a third location is illustrated in FIG. 15 in a similar configuration of interconnect segment 1505 that includes four flip-flops 1501, 1502, 1503 and 1504. The difference between the Table 150 and the Table 130 is that Q3 values are stuck at 1 for all eight clock cycles. According to some embodiments, there are N−3 zero's and N+3 ones in the Q4 output data for 2N clock cycles. The interconnect segment configuration 1505 is not a finite state machine and the circuit does not go back to its initial state. When N is equal to 4 as illustrated in FIG. 15, there are one (4−3=1) zero and seven (4+3=7) ones for Q4 in the Table 150.

Figure 16:
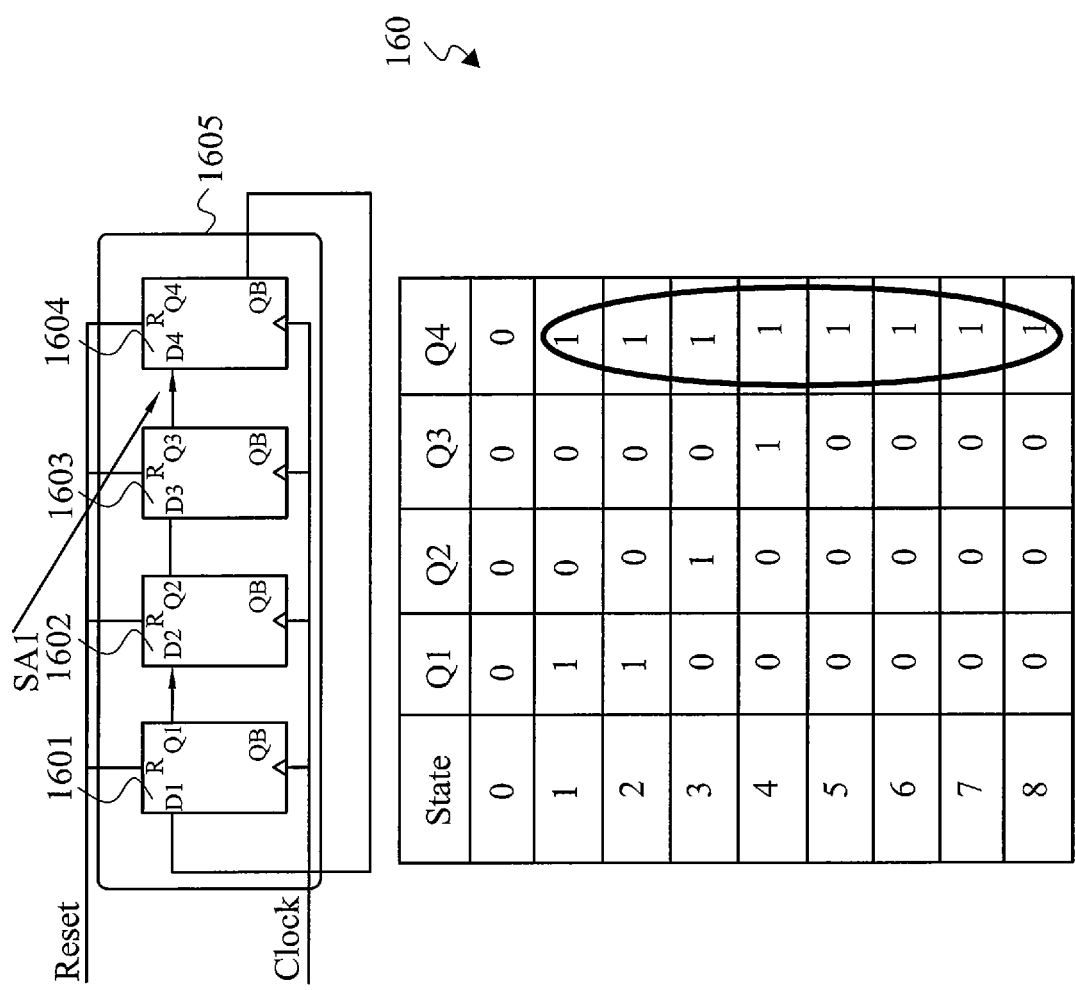
FIG. 16 is a schematic diagram of a circuit with a stuck-at-1 fault at a fourth location of four flip-flops and its corresponding logic table in accordance with some embodiments.

FIG. 16 is a schematic diagram of a circuit with a stuck-at-1 fault at a fourth location of four flip-flops and its corresponding logic table in accordance with some embodiments. Another stuck-at-1 fault is illustrated at a fourth location illustrated in FIG. 16 in a similar configuration of interconnect segment 1605 that includes four flip-flops 1601, 1602, 1603 and 1604. The difference between the Table 160 and the Table 130 is that Q4 values are stuck at 1 for all eight clock cycles. According to some embodiments, there are N−4 zeroes and N+4 ones in the Q4 output data for 2N clock cycles. The interconnect segment configuration 1605 is not a finite state machine and the circuit does not go back to its initial state. When N is equal to 4 as illustrated in FIG. 16, there are zero (4−4=0) zero and eight (4+4=8) ones for Q4 in the Table 160.

In summary, for a fault-free flip-flop chain of length N, there are equal numbers of zeroes and ones after 2N clock cycles. When the flip-flop chain is initialized to all zeroes (which is called "reset"), after 2N cycles, if the number of ones is larger than the number of zeroes on the output of the last flip-flop, a conclusion can be drawn that there is a stuck-at-1 fault in the flip-flop chain path. The location of the stuck-at-1 fault can be further identified by the number of ones observed at the last flip-flop (QN, the Q output of the Nth flip-flop). If the number of ones is 2N, then the stuck-at-1 fault is at the input of the last (or N-th) flip-flop in the flip-flop chain; if the number of ones is 2N−1, then the stuck-at-1 fault is at the input of the (N−1)-th flip-flop; if the number of ones is 2N−2, then the stuck-at-1 fault is at the input of the (N−2)-th flip-flop; if the number of ones is N+1, then there is either a stuck-at-1 fault, or a setup violation at the first flip-flop of the flip-flop scan chain.

If the number of ones is smaller than the number of zeroes, then there is a setup/hold violation in the flip-flop chain. A hold violation happens when the flip-flop holds the old value and cannot change from 1 to 0, or from 0 to 1 when it is supposed to change. A setup violation happens when the new data comes to a flip-flop earlier than the new data is supposed to be there.

When the number of zero's is equal to 2N, then there is a stuck-at-0 fault in the flip-flop scan chain. The location of the stuck-at-0 fault can be located by initializing the flip-flop scan chain to ones.

Figure 17:
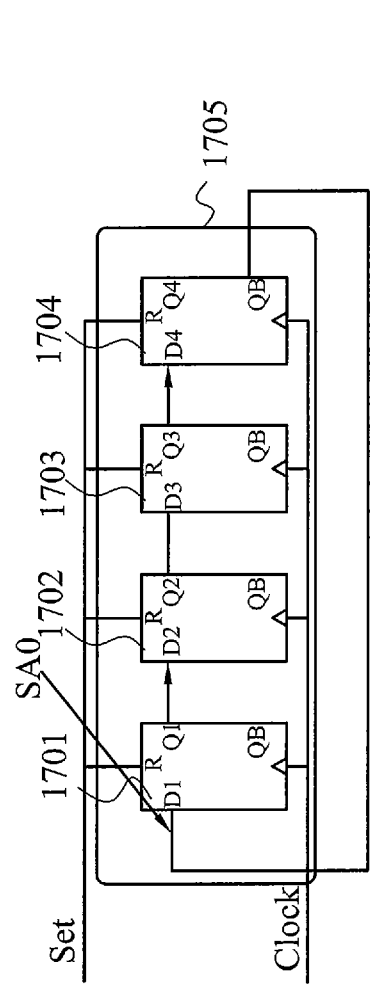
FIG. 17 is a schematic diagram of a circuit with a stuck-at-0 fault at a first location of four flip-flops and its corresponding logic table in accordance with some embodiments.

FIG. 17 is a schematic diagram of a circuit with a stuck-at-0 fault at a first location of four flip-flops and its corresponding logic table in accordance with some embodiments. Similar to FIG. 13 discussed above, the interconnect segment 1705 includes four flip-flops 1701, 702, 1703 and 1704. The first difference is that a "Set" signal sets the output of the flip-flops to 0 at appropriate clock cycles. the second difference is that, instead of a stuck-at-1 fault, a stuck-at-0 fault is located at the first flip-flop 1701. The Table 170 is similarly structured as the Table 130. At clock cycle 0, all flip-flops are initialized to 1, then at clock cycle 1, 0 is "Set" to the first flip-flop 1701, at each subsequent clock cycle, 0 is "set" to an additional subsequent flip-flop in the chain. It is clear by comparing the Tables 130 and 170, that the Table 170 is a reverse of the Table 130 because when all ones are placed by zeroes, and zeroes by ones, in Table 170, it becomes identical to Table 130, and vice versa. According to some embodiments, when the stuck-at-0 fault is located between the first flip-flop 1701 and the second flip-flop 1702, a corresponding table can be derived by reversing the Table 140. Following the same logic, when the stuck-at-0 fault is located between the second flip-flop 1702 and the third flip-flop 1703, a corresponding table can be derived by reversing the Table 150; when the stuck-at-0 fault is located between the third flip-flop 1703 and the fourth flip-flop 1704, a corresponding table can be derived by reversing the Table 160.

Similar to the method for determining the existence and location of the stuck-at-1 fault discussed above, a method for determining the existence and location of the stuck-at-0 fault is discussed below.

The first step is the determination of the existence of the stuck-at-0 fault. When the number of ones is smaller than the number of zeroes, then there is a stuck-at-0 fault in the flip-flop scan chain path. Then the location of the stuck-at-0 fault can be further determined by the number of zero's observed at the last flip-flop. Similar to the setting discussed above, assuming there are N flip-flops in the scan chain, if the number of zeroes is 2N, then the stuck-at-0 fault is located at the input of the last flip-flop (or the N-th flip-flop); if the number of zeroes is 2N−1, then the stuck-at-0 fault is located at the input of the (N−1)-th flip-flop in the scan chain; if the number of zeroes is 2N−2, then the stuck-at-0 fault is located at the input of the (N−2)-th flip-flop in the scan chain; if the number of zeroes is N+1, then the stuck-at-0 fault is located at the input of the first flip-flop in the scan chain.

According to some embodiments, if the number of ones is larger than the number of zeroes, then there is a stuck-at-1 fault and its location can be determined by initializing the scan chain to all zeroes and then implementing the method discussed following FIG. 16.

Figure 21:
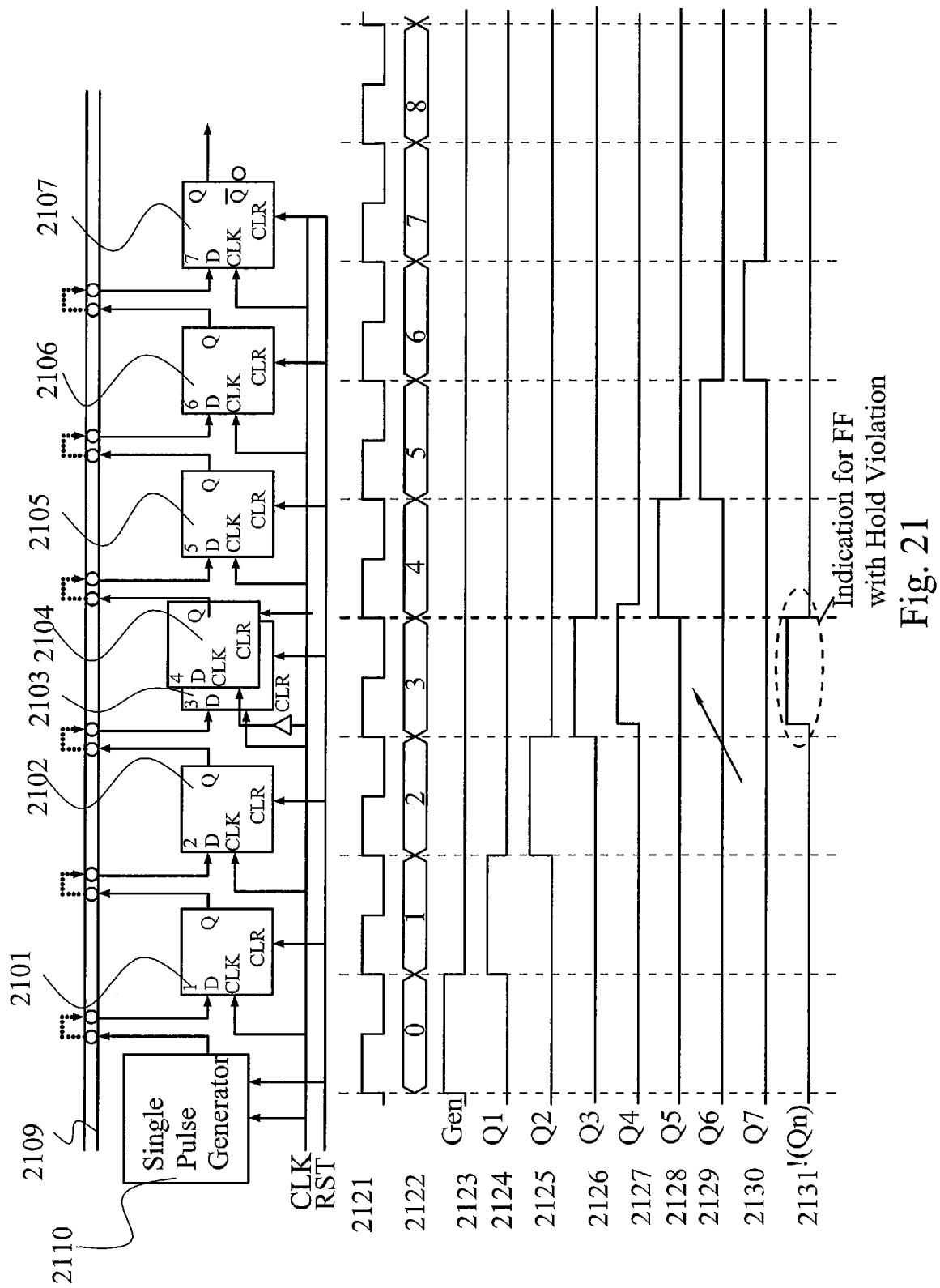
FIG. 21 is a schematic diagram of an on-chip scan-chain having a hold violation with 7 flip-flops and its corresponding logic waveforms in accordance with some embodiments.

FIG. 18 is a logic table of a circuit with 7 flip-flops under hold faults in accordance with some embodiments. A hold violation, or a hold fault, happens when a certain flip-flop cannot hold data for a long enough period of time (e.g., because of a delayed clock signal). Effectively, a single flip-flop hold violation is equivalent to a scan chain of one bit shorter as illustrated in FIG. 21 below. In order to detect a hold violation, the entire flip-flop scan chain of length N is initialized to all zeroes and then the test run for 2N cycles. If the number of ones is smaller than the number of zeroes observed on the last flip-flop, then there is a hold fault (or a setup fault as illustrated in FIG. 19) in the flip-flop scan chain. In the example illustrated in Table 180, the flip-flop scan chain has 7 flip-flops (N=7). After 14 (2N) clock cycles, six ones and 8 zeroes are observed on the last (7th) flip-flop. Because the number (6) of ones is smaller than the number (8) of zeroes, a possible hold fault is detected in the flip-flop chain.

Figure 22:
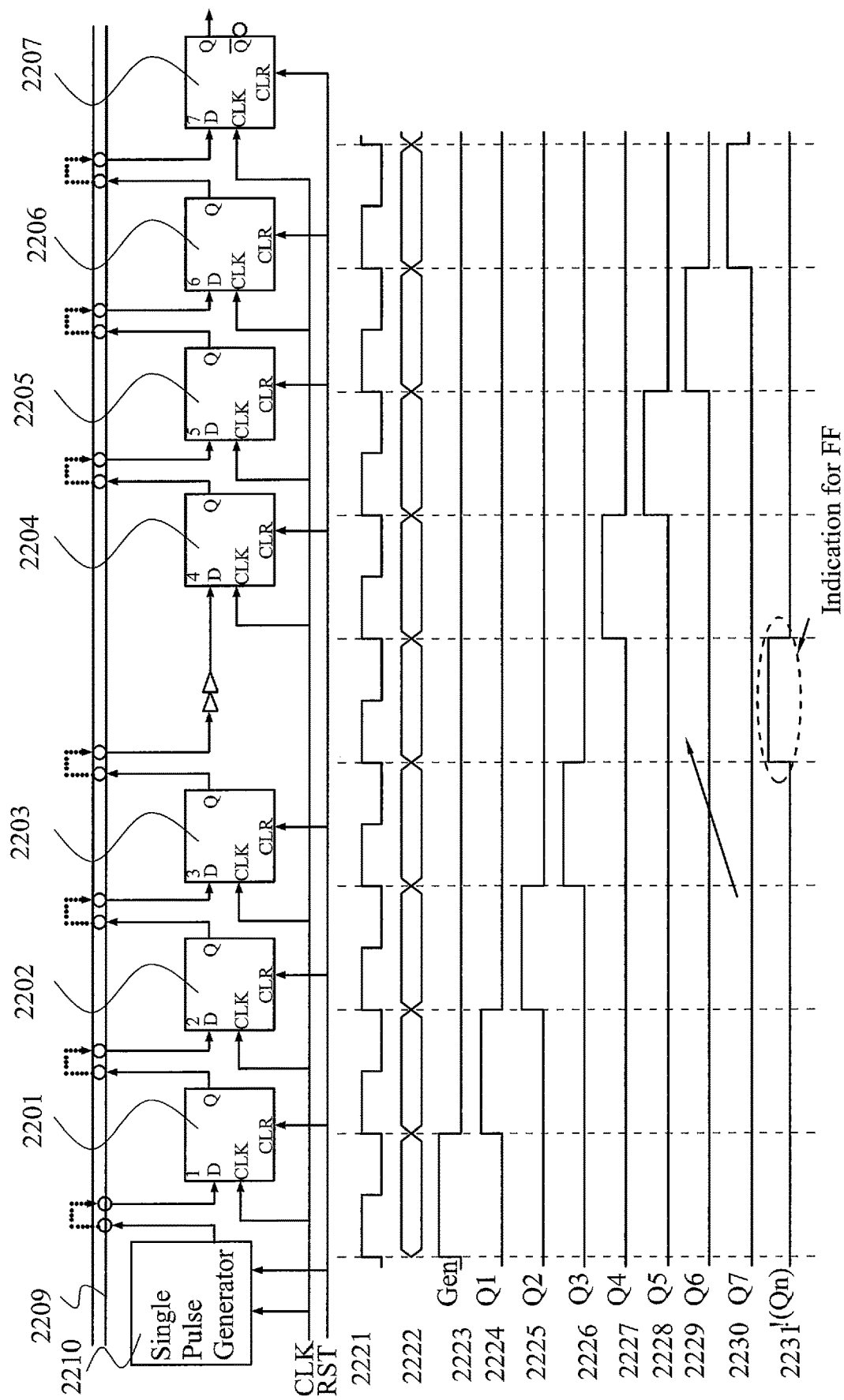
FIG. 22 is a schematic diagram of an on-chip scan-chain having a setup violation with 7 flip-flops and its corresponding logic waveforms in accordance with some embodiments.

FIG. 19 is a logic table of a circuit with 7 flip-flops under setup faults in accordance with some embodiments. A setup violation, or a setup fault, happens when the data in the flip-flop arrives earlier than it is supposed to. Effectively, a single flip-flop setup violation is equivalent to a scan chain of one bit longer as illustrated in FIG. 22 below. Using a similar method to that discussed above for FIG. 18, the entire flip-flop scan chain is initialized to zeroes, after 2N clock cycles, if the number of ones is smaller than the number of zeroes, then there is either a setup fault or a hold fault in the scan chain. In the example illustrated in Table 190, the flip-flop scan chain has 7 flip-flops (N=7). After 14 (2N) clock cycles, six ones and 8 zeroes are observed on the last (7th) flip-flop. Because the number (6) of ones is smaller than the number (8) of zeroes, a possible setup fault is detected in the flip-flop chain According to some embodiments, the methods illustrated in FIG. 18 and FIG. 19 produce the same results for both hold and setup faults, so additional steps are implemented to differentiate setup fault and hold fault after the number of ones is determined to be smaller than the number of zeroes after 2N clock cycles on the last flip-flop.

According to some embodiments, a ring counter is a type of counter composed of a type of circular shift register. The output of the last shift register is fed to the input of the first register. A Johnson counter is a ring counter with an inversion. The interconnect segments illustrated in FIGS. 12-17 are all Johnson counters because the QB (Q-bar, the inversion of the Q output) is fed to the input of the first flip-flop.

According to some embodiments, the Johnson counter is implemented to diagnose setup and hold faults. According to some embodiments, built-in self-test (BIST) based solutions are implemented to meet scan out timing and high speed scan shift clock specifications.

Figure 20:
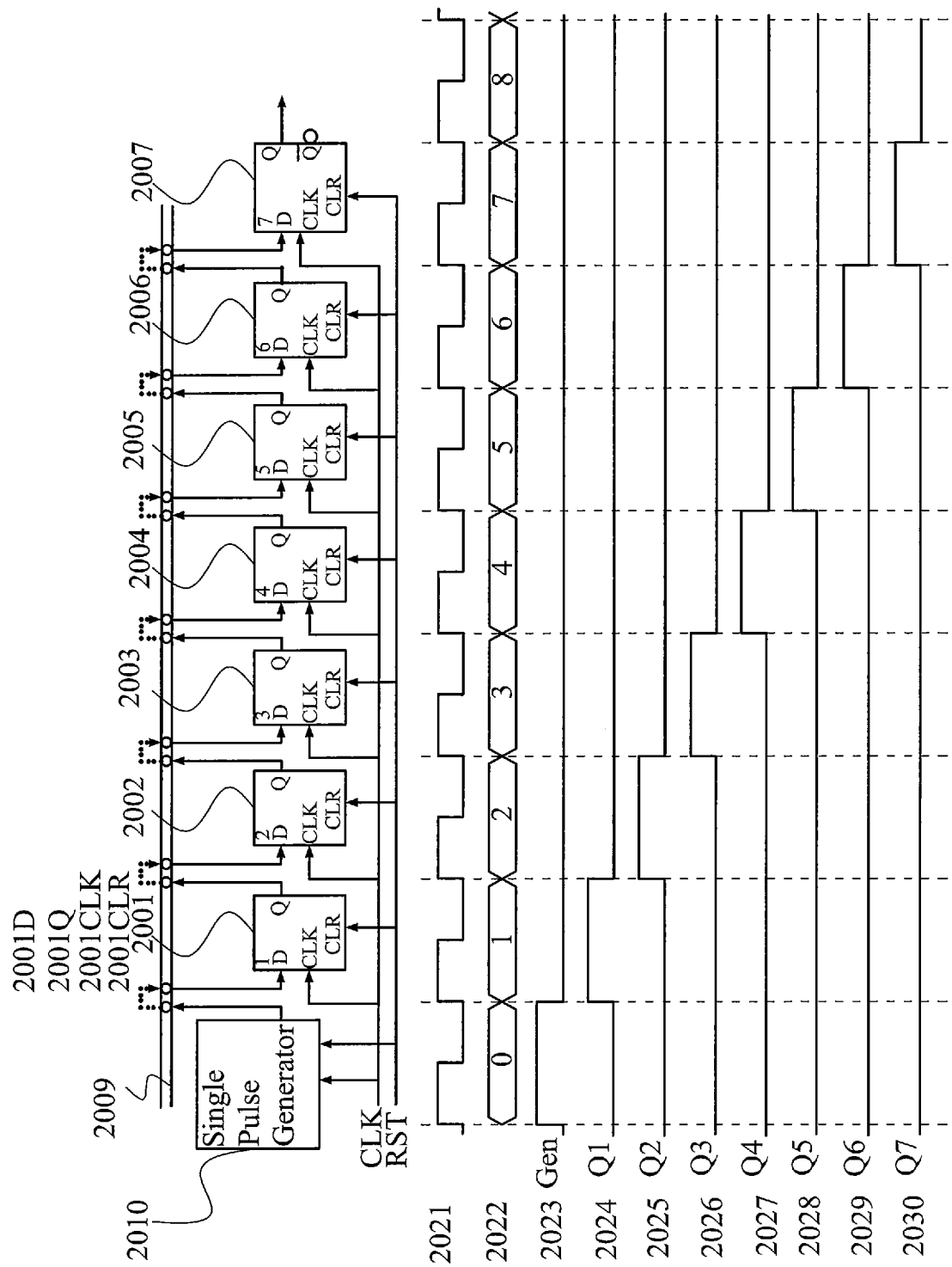
FIG. 20 is a schematic diagram of a fault-free on-chip scan-chain with 7 flip-flops and its corresponding logic waveforms in accordance with some embodiments.

FIG. 20 is a schematic diagram of a fault-free on-chip scan-chain with 7 flip-flops and its corresponding logic waveforms in accordance with some embodiments. According to some embodiments, seven flip-flops 2001 through 2007 are implemented in the flip-flop scan chain, and each flip-flop has a D input (e.g., 2001D), a Q output (e.g., 2001Q), a clock (e.g., 2001CLK), and a reset (e.g., 2001CLR). In the case of the last flip-flop, there is an additional QB (Q-bar, the inversion of Q) signal for implementation of Johnson Counter. A signal pulse generator unit 2010 generates clock signals for all flip-flops in the flip-flop scan chain, a line 200 connects the single pulse generator unit 2010 with the first flip-flop 2001, and connects each flip-flop with its successor (except the last one). Signal 2021 is the clock signal and signal 2022 is the corresponding shift chain. Signal 2023 is the initial pulse signal generated by the single pulse generator unit 2010. Signals 2024, 2025, 2026, 2027, 2028, 2029 and 2030 are the corresponding pulse signals shifted along the flip-flop scan chain path. FIG. 20 is an illustration of a fault-free flip-flop scan chain in which there is no fault and there is one and only one flip-flop holding a value of one in any clock cycle.

FIG. 21 is a schematic diagram of an on-chip scan-chain having a hold violation with 7 flip-flops and its corresponding logic waveforms in accordance with some embodiments. According to some embodiments, FIG. 21 illustrates a similar configuration to that shown in FIG. 20, except that there is a hold fault at the third flip-flop in FIG. 21. As discussed above, a scan chain with a hold fault is equivalent to a scan chain of one bit shorter. Similar to the description of FIG. 20, signal 2121 is the clock cycle signal and the signal 2122 is the shift signal. The signals 2123 through 2130 are the signals observed on the flip-flops 2101 through 2107. The signal 2131 is a logic XOR of signals 2123 through 2130. Between the signal 2126 and the signal 2127, there is an overlap. Accordingly, the XOR signal 2131 produces a pulse at the corresponding location and the shift counter is frozen on this signal. As a result, the value of the shift counter identifies the location of the flip-flop (i.e., the third flip-flop) with the hold fault. According to some embodiments, long flip-flop scan chains can be divided into shorter chains with one flip-flop overlap to reduce XOR tree timing impact.

FIG. 22 is a schematic diagram of an on-chip scan-chain having a setup violation with 7 flip-flops and its corresponding logic waveforms in accordance with some embodiments. According to some embodiments, FIG. 22 illustrates a similar configuration as FIG. 20 except that there is a setup fault at the fourth flip-flop. As discussed above, a scan chain with a setup fault is equivalent to a scan chain of one bit longer. Similar to the discussion in FIG. 20, signal 2221 is the clock cycle signal and the signal 2222 is the shift signal.

The signals 2223 through 2230 are the signals observed on the flip-flops 2201 through 2207. The signal 2231 is a logic OR of signals 2223 through 2230. Between the signal 2226 and the signal 2227, the OR signal 2231 produces a pulse at the corresponding location and the shift counter is frozen on this signal. As a result, the value of the shift counter identifies the location of the flip-flop (i.e., the third flip-flop) with the setup fault. According to some embodiments, similar to the discussion in FIG. 21, long flip-flop scan chains can be divided into shorter chains with one flip-flop overlap to reduce OR tree timing impact.

Figure 23:
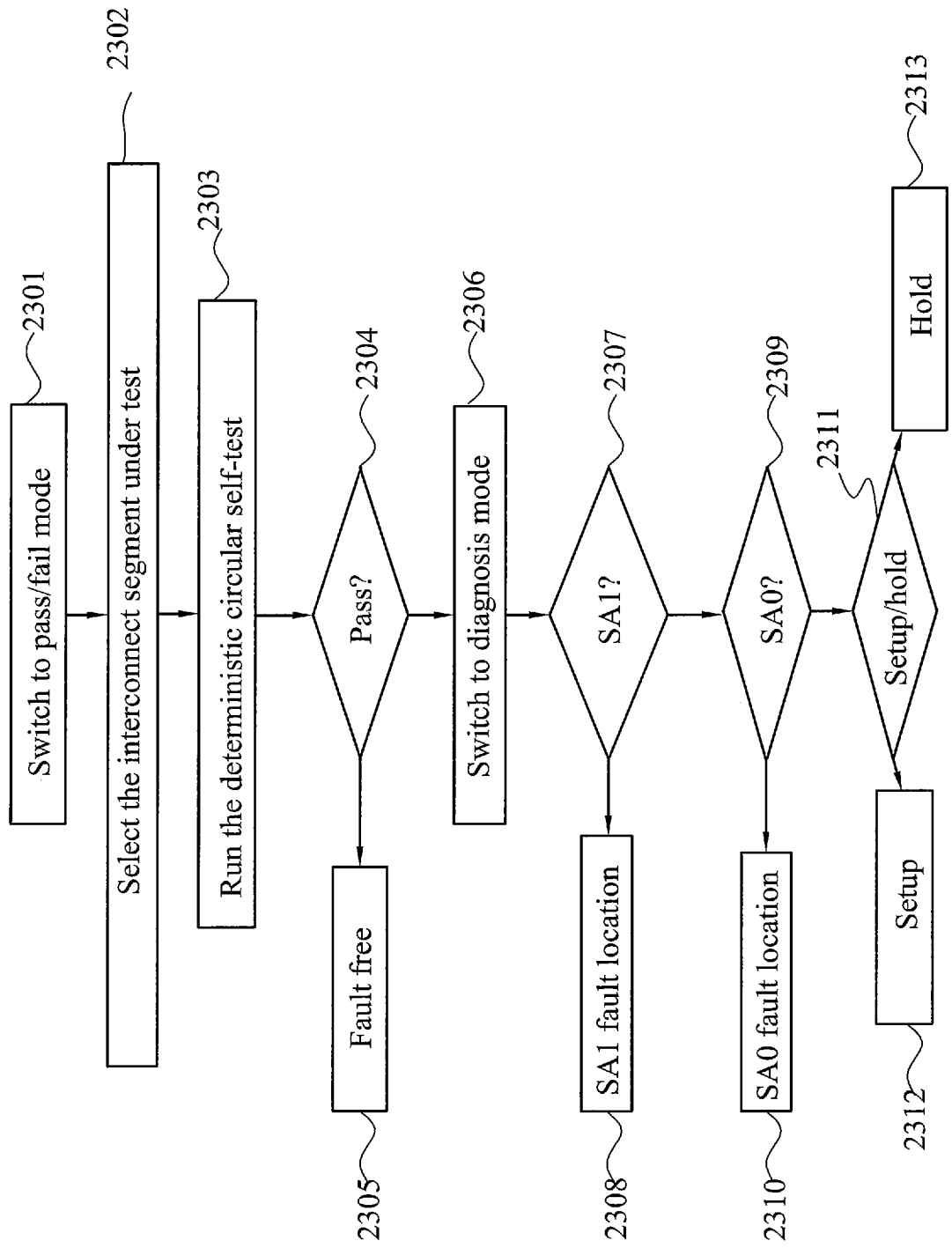
FIG. 23 is a flowchart illustrating the method for deterministic circular built-in self-test in accordance with some embodiments.

FIG. 23 is a flowchart illustrating the method for deterministic circular built-in self-test in accordance with some embodiments. According to some embodiments, the flowchart in FIG. 23 summarizes the discussion of the method above. According to some embodiments, the method for deterministic circular built-in self-test is implemented on the circuit structure illustrated in FIG. 11.

According to some embodiments, at the step 2301, the deterministic circular built-in self-test circuit 11100 in FIG. 11 is switched to pass/fail mode by the control logic unit 11034. At step 2302, the control logic unit 11304 selects the interconnect segment under test through the controlling of multiplexers 11102B through 11202B. Once an interconnect segment is selected, for example the interconnect segment 11100, at step 2303, the deterministic circular self-test is run by initializing all flip-flops in the scan chain to zeroes. Then ones are shifted in consecutively for 2N clock cycles, where N is the number of flip-flops in the scan chain of the interconnect segment. At step 2304, a comparison is conducted between the number of ones and number of zeroes observed on the last flip-flop to determine whether the test result is a pass or fail. At the step 2305, if the number of ones and zeroes are equal, then no fault is detected and the selected interconnected segment is a fault free circuit. If the numbers of ones and zeroes are not equal, at the step 2306, the circuit 11100 is switched to diagnosis mode and a determination of stuck-at-1 fault or stuck-at-0 fault is conducted. At step 2307, if the number of ones is larger than the number of zeroes, then there is a stuck-at-1 fault in the path of the selected interconnect segment. At step 2308, the location of the stuck-at-1 fault is determined. At step 2309, if the number of zeroes is equal to 2N, then there is a stuck-at-0 fault in the scan chain of the selected interconnected segment. At step 2310, the location of the stuck-at-0 fault is determined. At step 2309, if the number of ones is smaller than the number of zeroes, then there is a setup or hold fault. Then at step 2311, the method determines whether there is a setup fault or a hold fault in the scan chain. At step 2311, the scan chain is initialized to ones, and zeroes are shifted in consecutively for 2N clock cycles, where N is the number of flip-flops in the scan chain of the interconnect segment. A comparison is conducted between the number of ones and number of zeroes observed on the last flip-flop. The diagnosis unit 11111 is activated to determine whether there is a setup fault or a hold fault according to the methods shown in FIG. 21 and FIG. 22. At step 2312, by using the OR gate 11211A, the non-zero output signal on the OR gate 11211A produces the location of a setup fault; at step 2313, by using the XOR gate 11211B, the non-zero output signal on the XOR gate 11211B produces the location of a hold fault. According to some embodiments, the above steps are repeated for each of the interconnect segments in the circuit 11100 in FIG. 11 to determine the types of faults in each of the interconnect segment and the location of each fault.

Various embodiments using the concepts provided herein can use clock synchronization with a single clock speed to ensure shift testing without requiring complex synchronization of two clocks or at-speed transition generation. This method allows use of a single pass flow for both DC and AC testing. The method can provide testing of actual functional inter-die connections (i.e., connections that are used during operations other than scan chain testing) as part of the scan chain shift test. Embodiments of this disclosure are suitable for designs with large or small numbers of interconnects. Although examples are described above using 3DICs with hybrid bonding, the architecture and methods described herein can be applied to any 3DIC and to any 2.5DIC (with an interposer).

In some embodiments, a device comprises: a first die having disposed thereon a first plurality of latches wherein ones of the first plurality of latches are operatively connected to an adjacent one of the first plurality of latches; and a second die having disposed thereon a second plurality of latches wherein ones of the second plurality of latches are operatively connected to an adjacent one of the second plurality of latches. Each latch of the first plurality of latches on said first die corresponds to a latch in the second plurality of latches on said second die. Each set of corresponding latches are operatively connected. A scan path comprises a closed loop comprising each of said first and second plurality of latches. One of the second plurality of latches is operatively connected to another one of the second plurality of latches via an inverter.

In some embodiments, a device comprises a first die and a second die with interconnections between the first die and the second die. Each of the first and second dies comprises: a plurality of latches, including a respective latch corresponding to each one of the interconnections; and a plurality of multiplexers. Each multiplexer is connected to a respective one of the plurality of latches and a respective functional path. Respective ones of the plurality of multiplexers in the first die are connected to a subset of latches within the plurality of latches in one of the first die and the second die. The subset of latches are non-adjacent from each other among the plurality of latches. A scan path comprises a closed loop comprising each of the plurality of latches in the first and second dies.

In some embodiments, a device comprises a first die and a second die. At least one of the first die and second die includes level shifters and interconnections between the first die and the second die. Each of the first and second dies comprises: a plurality of latches, including a respective latch corresponding to each one of the interconnections, and a plurality of multiplexers. Each multiplexer is connected to a respective one of the plurality of latches and a respective functional path and is arranged for receiving and selecting one of a scan test pattern or a signal from the functional path for outputting during a scan chain test of the first die and second die. The plurality of latches in the first die includes a first latch without a connection to a multiplexer. A scan path comprises a closed loop comprising each of the plurality of latches in the first and second dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first die having disposed thereon a first plurality of latches wherein ones of the first plurality of latches are operatively connected to an adjacent one of the first plurality of latches; and
a second die having disposed thereon a second plurality of latches wherein ones of the second plurality of latches are operatively connected to an adjacent one of the second plurality of latches, wherein:
   each latch of the first plurality of latches on said first die corresponds to a latch in the second plurality of latches on said second die,
   each set of corresponding latches are operatively connected,
   a scan path comprises a closed loop comprising each of said first and second plurality of latches,
   the scan path goes consecutively through: a first latch in the first plurality of latches in the first die, a second latch in the second plurality of latches in the second die, a third latch in the second plurality of latches in the second die, and a fourth latch in the first plurality of latches in the first die,
   the first latch and the fourth latch are adjacent to each other in the first die, and
   the second latch and the third latch are adjacent to each other in the second die.

2. The device of claim 1, wherein the second die further comprises a clock and control unit.

3. The device of claim 1, wherein the second die further comprises a phase lock loop unit.

4. The device of claim 1, wherein the second die further comprises an analyzer unit.

5. The device of claim 1, wherein the first plurality of latches and the second plurality of latches comprise D flip-flops.

6. The device of claim 1, further comprising a plurality of level shifters for changing an amplitude of signals transmitted between the first die and the second die.

7. The device of claim 1, wherein the first die has a first clock and the second die has a second clock, and the first clock and second clock are synchronized with each other.

8. The device of claim 1, wherein the first plurality of latches in the first die and the second plurality of latches in the second die are not of the same type.

9. The device of claim 1, wherein the first plurality of latches includes a subset of latches, each latch in the subset transmitting a signal from the first die to a corresponding latch in the second die.

10. The device of claim 1, wherein:
the first plurality of latches includes a first number of latches;
the second plurality of latches includes a second number of latches; and
the first and second numbers are different from each other.

11. A device, comprising:
a first die; and
a second die with interconnections between the first die and the second die,
wherein each of the first and second dies comprises:
   a plurality of latches, including a respective latch corresponding to each one of the interconnections; and
   a plurality of multiplexers, each multiplexer connected to a respective one of the plurality of latches and a respective functional path,
   wherein respective ones of the plurality of multiplexers in the first die are connected to a subset of latches within the plurality of latches in one of the first die and the second die,
   wherein the subset of latches are non-adjacent from each other among the plurality of latches,
   wherein a scan path comprises a closed loop comprising each of the plurality of latches in the first and second dies,
   wherein the scan path goes consecutively through: a first latch in the first die, a second latch in the second die, a third latch in the second die, and a fourth latch in the first die,
   wherein the first latch and the fourth latch are adjacent to each other in the first die,
   wherein the second latch and the third latch are adjacent to each other in the second die.

12. The device of claim 11, wherein the plurality of latches in the first die and the second die include D flip-flops.

13. The device of claim 11, wherein respective ones of the plurality of multiplexers are connected to alternating ones of the plurality of latches in the first die.

14. The device of claim 11, wherein a respective one of the plurality of multiplexers receives one input from a corresponding one of the plurality of latches in the first die, receives another input from a functional path in the first die, and transmits an output to a corresponding one of the plurality of latches in the second die.

15. The device of claim 11, wherein one of the plurality of latches in the first die is connected to output a signal to one of the plurality of multiplexers in the second die and receives an input signal from an adjacent latch in the plurality of latches within the first die, wherein the adjacent latch does not output a signal to any of the plurality of multiplexers in the second die.

16. The device of claim 11, wherein the plurality of latches includes a subset of the plurality of latches, each latch in the subset transmitting a signal from one of the first and second dies to a corresponding latch in the other of the first and second dies, and each latch in the subset is connected to a first input of a corresponding one of the plurality of multiplexers.

17. The device of claim 11, wherein the plurality of latches are connected in a chain having a first scan chain output, and an output of at least one latch other than a last one of the plurality of latches is transmitted to a second scan chain output.

18. Device of claim 11, wherein two or more of the plurality of multiplexers have taps for outputting signals from the device.

19. The device of claim 11, wherein the plurality of latches include a latch in the first die without a connection to a corresponding multiplexer or functional path, and the latch without the connection to a corresponding multiplexer or functional path is configured to transmit a signal to a corresponding latch in the second die by a testing connection that is used during scan chain testing.

20. A device, comprising:
a first die; and
a second die, at least one of the first die and second die including level shifters and interconnections between the first die and the second die, wherein each of the first and second dies comprises a plurality of latches, including a respective latch corresponding to each one of the interconnections, a scan path comprises a closed loop comprising each of the plurality of latches in the first and second dies, the scan path goes consecutively through: a first latch in the plurality of latches in the first die, a second latch in the plurality of latches in the second die, a third latch in the plurality of latches in the second die, and a fourth latch in the plurality of latches in the first die, the first latch and the fourth latch are adjacent to each other in the first die, and the second latch and the third latch are adjacent to each other in the second die.

* * * * *